(12) United States Patent
Clayton et al.

(10) Patent No.: US 10,336,139 B2
(45) Date of Patent: Jul. 2, 2019

(54) BODY PLY SHAPE FOR A TIRE

(71) Applicants: William B. Clayton, Simpsonville, SC (US); Daniel McEachern Hicks, Greenville, SC (US)

(72) Inventors: William B. Clayton, Simpsonville, SC (US); Daniel McEachern Hicks, Greenville, SC (US)

(73) Assignee: COMPAGNIE GENERALE DES ETABLISSEMENTS MICHELIN, Clermont-Ferrand (FR)

( * ) Notice: Subject to any disclaimer, the term of this patent is extended or adjusted under 35 U.S.C. 154(b) by 330 days.

(21) Appl. No.: 15/120,777

(22) PCT Filed: Feb. 27, 2014

(86) PCT No.: PCT/US2014/018961
§ 371 (c)(1),
(2) Date: Aug. 23, 2016

(87) PCT Pub. No.: WO2015/130287
PCT Pub. Date: Sep. 3, 2015

(65) Prior Publication Data
US 2016/0361951 A1     Dec. 15, 2016

(51) Int. Cl.
*B60C 9/02* (2006.01)
*B29D 30/00* (2006.01)
(Continued)

(52) U.S. Cl.
CPC ........ *B60C 9/0292* (2013.01); *B29D 30/0061* (2013.01); *B60C 9/18* (2013.01); *G06F 17/50* (2013.01); *B60C 2009/1828* (2013.01)

(58) Field of Classification Search
CPC ............ B60C 9/02; B60C 9/0292; B60C 3/04; B60C 9/2006; B60C 11/0083; B60C 9/22; B60C 9/28
See application file for complete search history.

(56) References Cited

U.S. PATENT DOCUMENTS

| 4,037,637 A | 7/1977 | Arimura |
| 4,155,392 A | 5/1979 | Duderstadt |
(Continued)

FOREIGN PATENT DOCUMENTS

| EP | 0103984 A2 * | 3/1984 | ............... B60C 3/04 |
| EP | 0103984 A2 | 3/1984 | |
(Continued)

OTHER PUBLICATIONS

Some Theory Study of Contour Design for Radial Tire, Pan Tao, full text database of Excellent master's degree thesis in China, col. 12, 2011, P016-124publixhed Dec. 15, 2011(English Abstract provided—no full translation readily available).
(Continued)

*Primary Examiner* — Jodi C Franklin
(74) *Attorney, Agent, or Firm* — Dority & Manning, P.A.

(57) ABSTRACT

A tire is provided having a body ply that is displaced from the conventional equilibrium curve along the shoulder and upper side wall region of the tire in a manner that provides more uniform inflation growth along the crown region so as to reduce differences in rigidity between the center and shoulders of the tire, reduce load sensitivity, and/or decrease the propensity for cracking. A method for designing or constructing such a tire is also provided.

18 Claims, 21 Drawing Sheets

(51) Int. Cl.
    *B60C 9/18*     (2006.01)
    *G06F 17/50*     (2006.01)

(56) References Cited

U.S. PATENT DOCUMENTS

| | | | |
|---|---|---|---|
| 4,387,758 A | | 6/1983 | Matsuda |
| 4,688,615 A | | 8/1987 | Lee |
| 4,785,861 A | * | 11/1988 | Fujiwara .................. B60C 3/04 152/209.14 |
| 4,955,416 A | | 9/1990 | Takeuchi |
| 5,052,457 A | * | 10/1991 | Iida .......................... B60C 3/04 152/454 |
| 5,178,716 A | | 1/1993 | Hanada |
| 5,203,934 A | * | 4/1993 | Iida .......................... B60C 3/04 152/454 |
| 5,565,047 A | | 10/1996 | Tanaka |
| 5,637,162 A | | 6/1997 | Rhyne |
| 5,803,998 A | | 9/1998 | Ohsawa |
| 6,499,522 B1 | | 12/2002 | Cluzel |
| 6,701,987 B1 | | 3/2004 | Abbott |
| 7,712,499 B2 | | 5/2010 | Yano |
| 8,225,834 B2 | | 7/2012 | Isobe |
| 2009/0228254 A1 | * | 9/2009 | Seto ........................ B60C 9/02 703/6 |
| 2009/0229722 A1 | * | 9/2009 | Isobe .................... B60C 9/2006 152/209.18 |
| 2010/0116402 A1 | * | 5/2010 | Isobe .................... B60C 9/2006 152/526 |
| 2010/0139834 A1 | | 6/2010 | Koga |
| 2011/0220263 A1 | | 9/2011 | Michiels |

FOREIGN PATENT DOCUMENTS

| | | | | |
|---|---|---|---|---|
| EP | 0194108 A2 | * | 9/1986 | ............... B60C 3/04 |
| JP | H01085801 A | | 3/1989 | |
| JP | H0367703 | | 3/1991 | |
| JP | 07025203 A | | 1/1995 | |
| JP | 2007238041 A | | 9/2007 | |
| JP | 2007326518 | | 12/2007 | |
| JP | 2011235785 | | 11/2011 | |
| WO | WO2007/131581 | | 11/2007 | |

OTHER PUBLICATIONS

European Search Report for Application No. 14884018.4 dated Sep. 19, 2017.

European Search Report for Application No. 14883965.7 dated Sep. 19, 2017.

International Search Report re: PCT/US2014/018961 dated Jun. 16, 2014.

International Search Report re: PCT/US2014/018953 dated Jun. 13, 2014.

Coba Tyre . Archived webpage from cobatyre.com Aug. 24, 2013 (Aug. 24, 2013) retrieved on 24 May 12-19, 2014 (May 24, 2014) <URL: http://web.archive.org/web/20130824085300/http://cobatyre.com/research/> entire document.

* cited by examiner

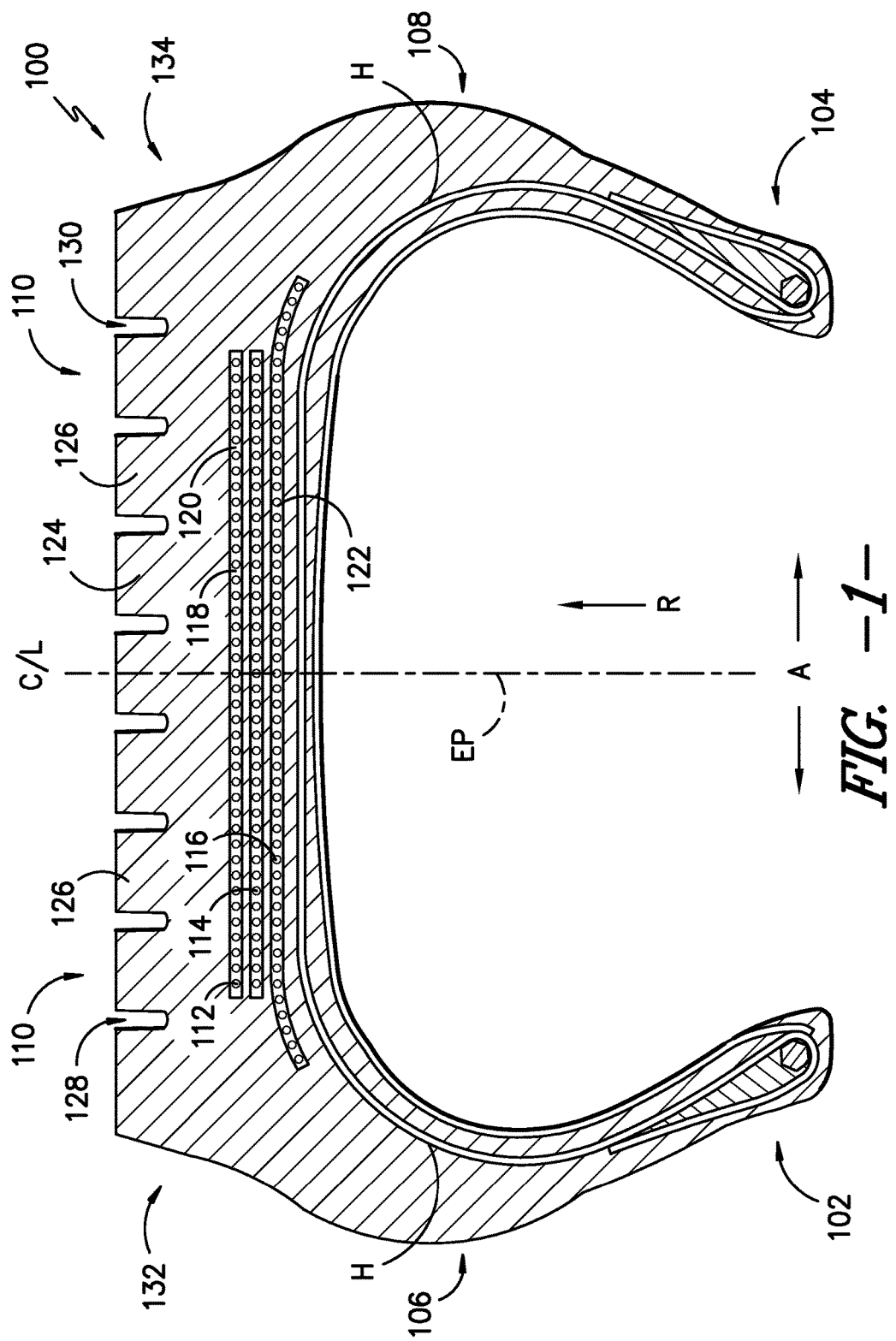
FIG. -1-

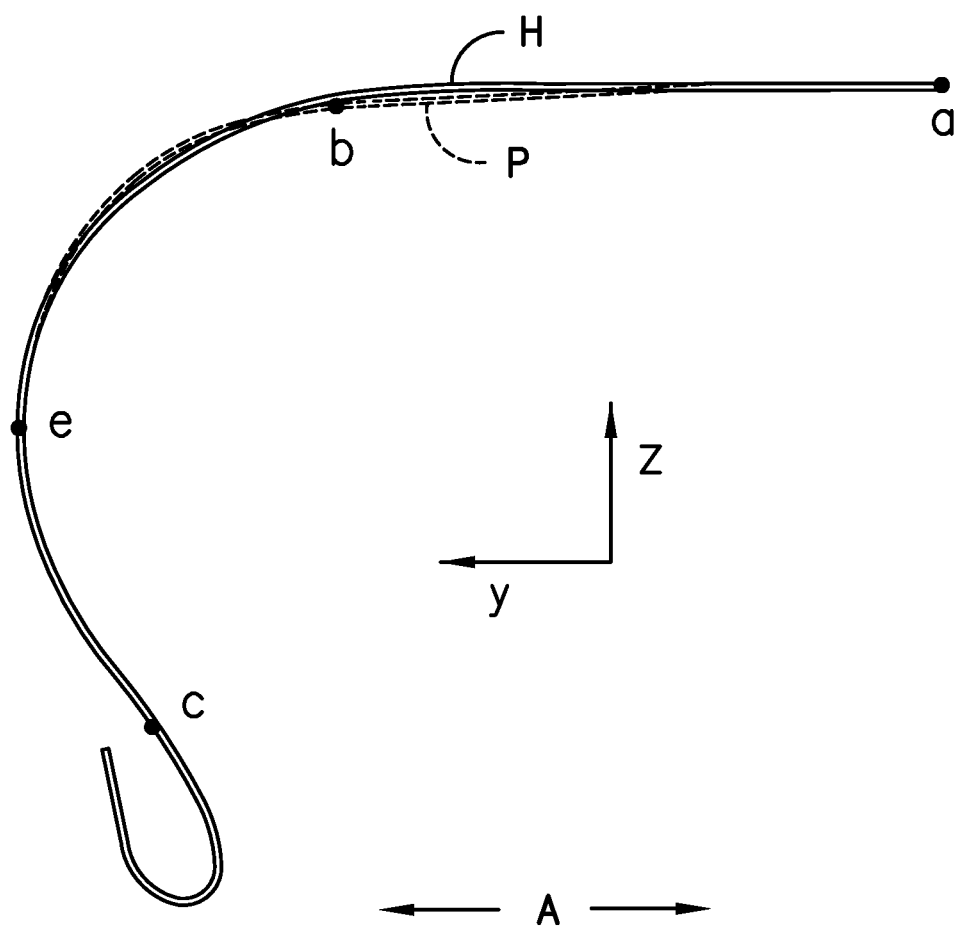
FIG. -2-

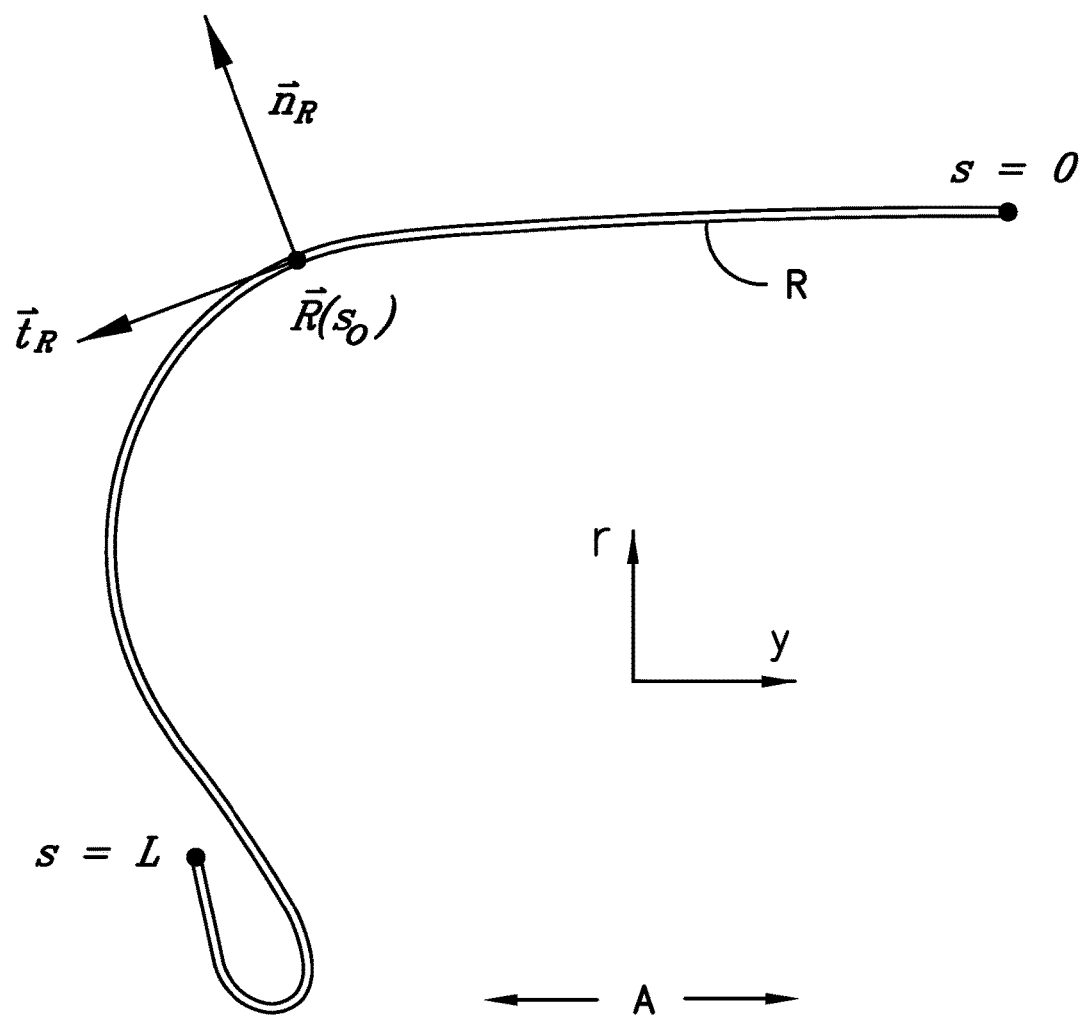
FIG. -3-

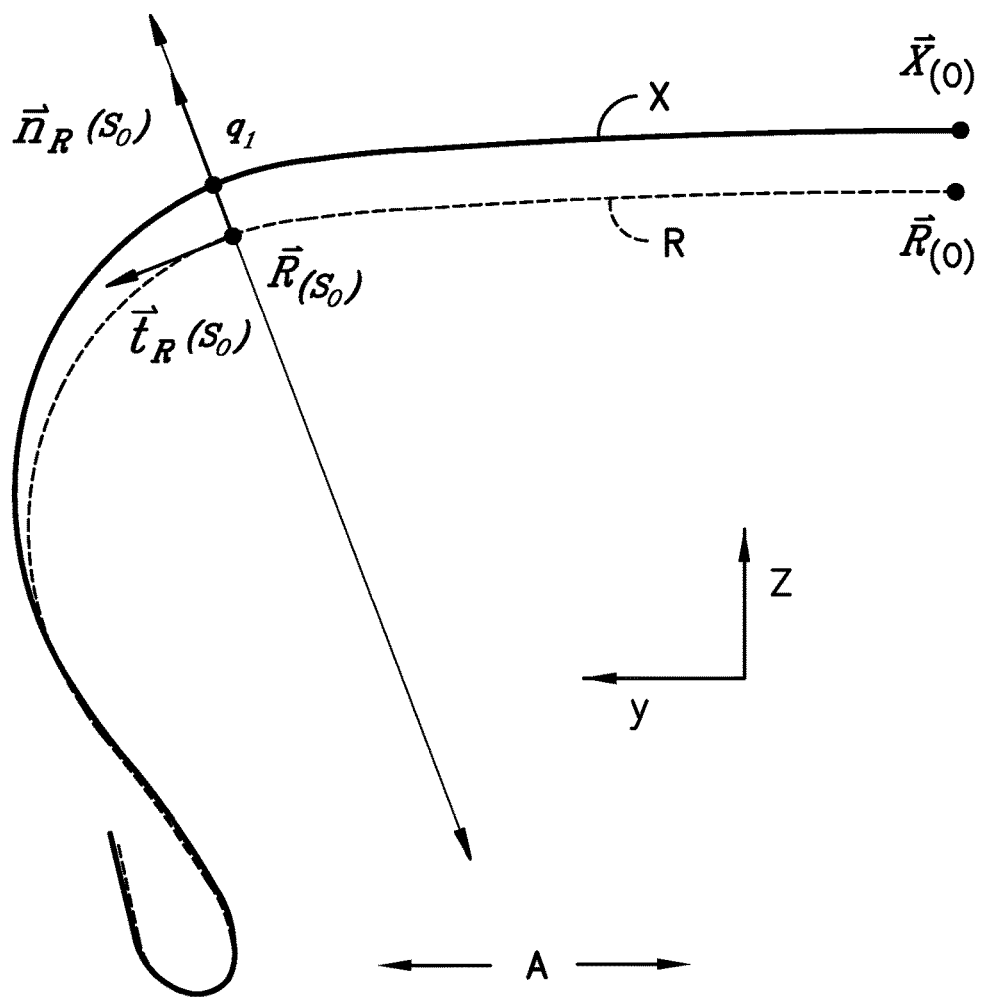
FIG. −4−

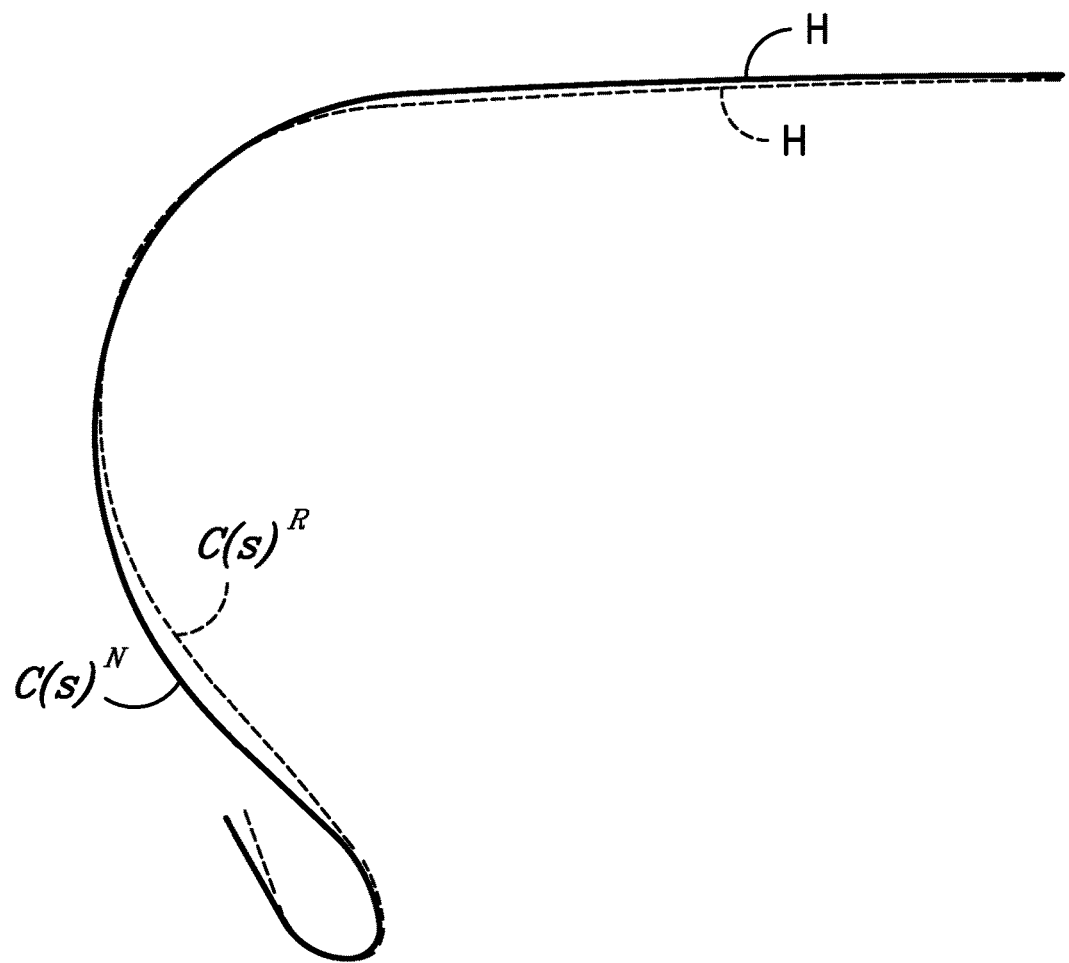
FIG. −5−

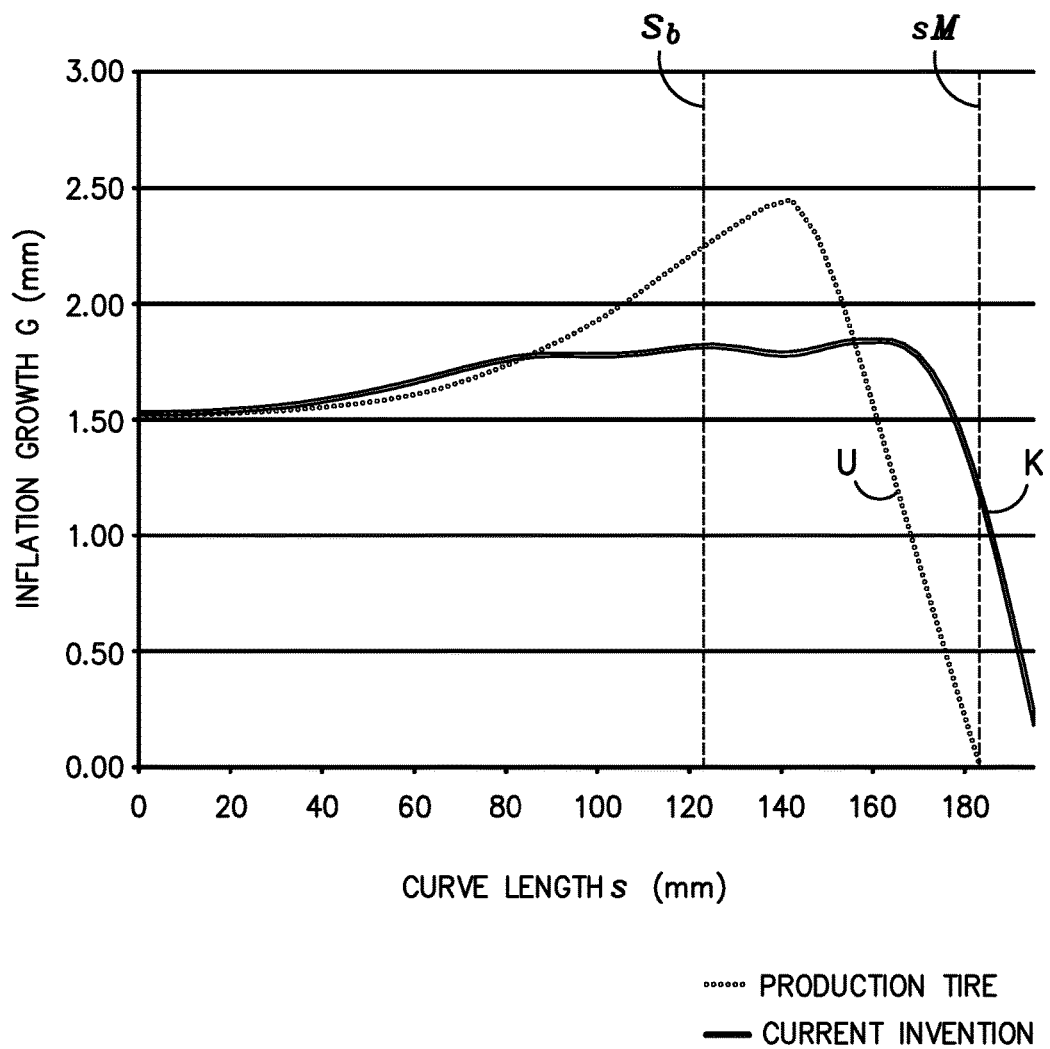
FIG. -6-

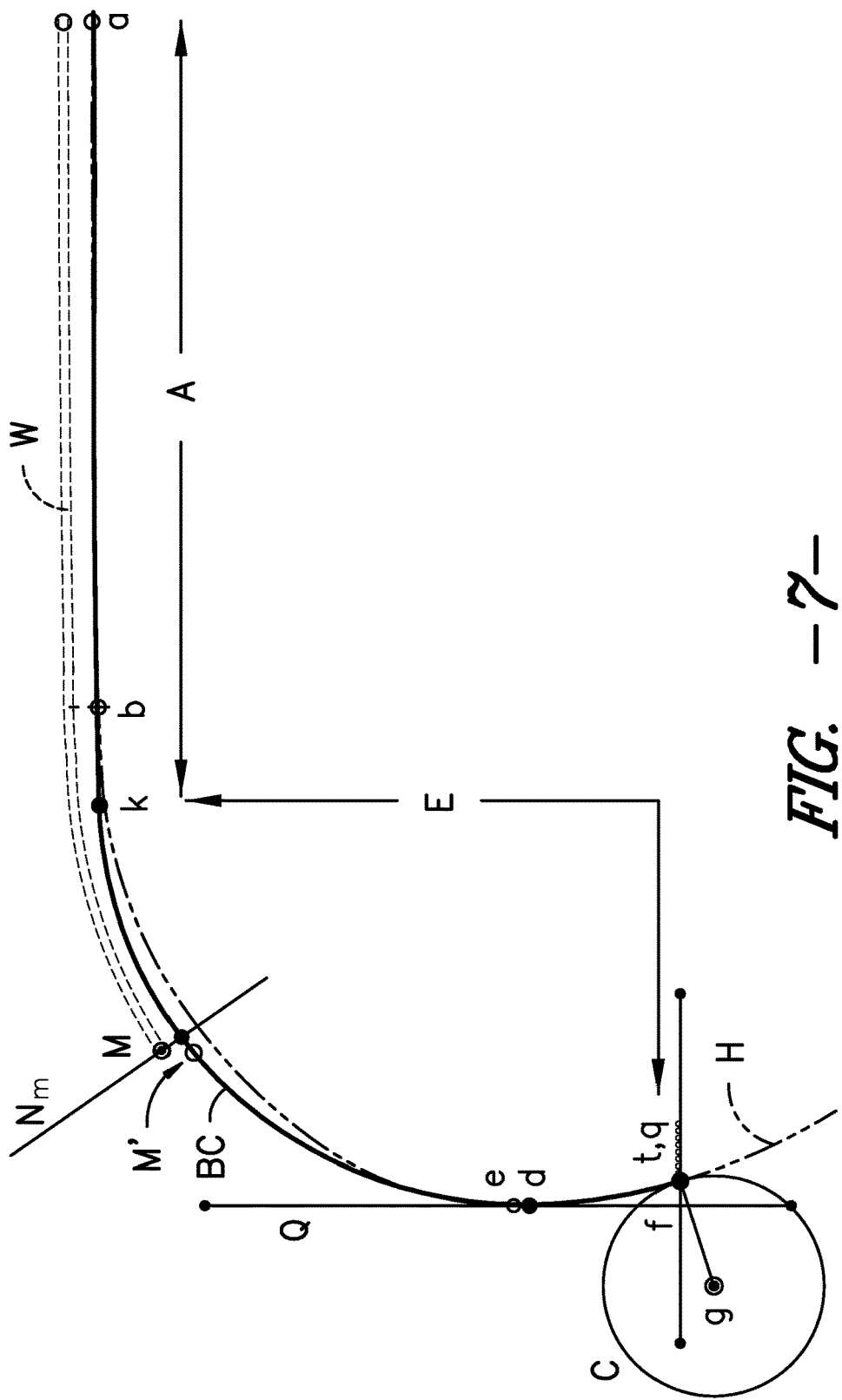
FIG. -7-

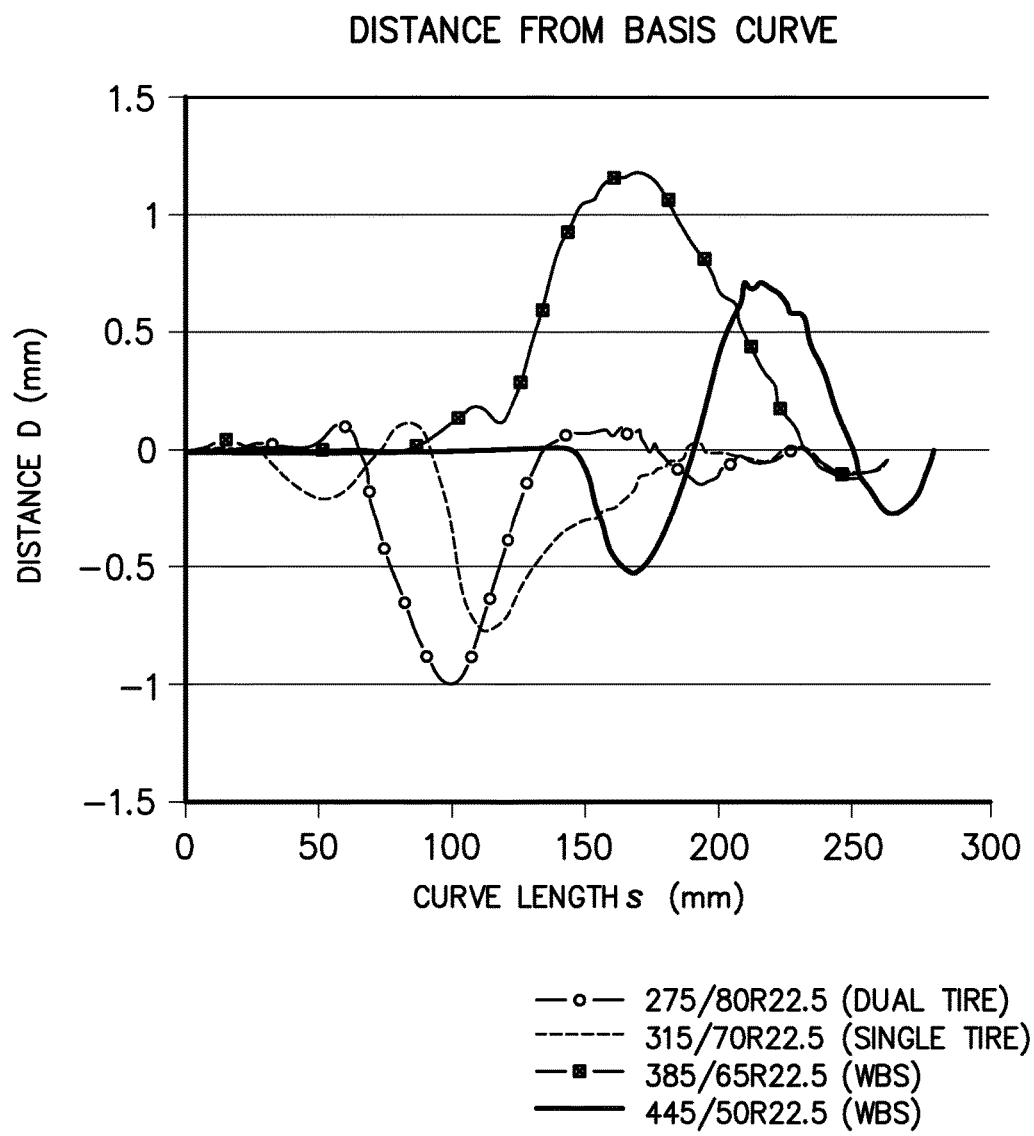
FIG. -8-

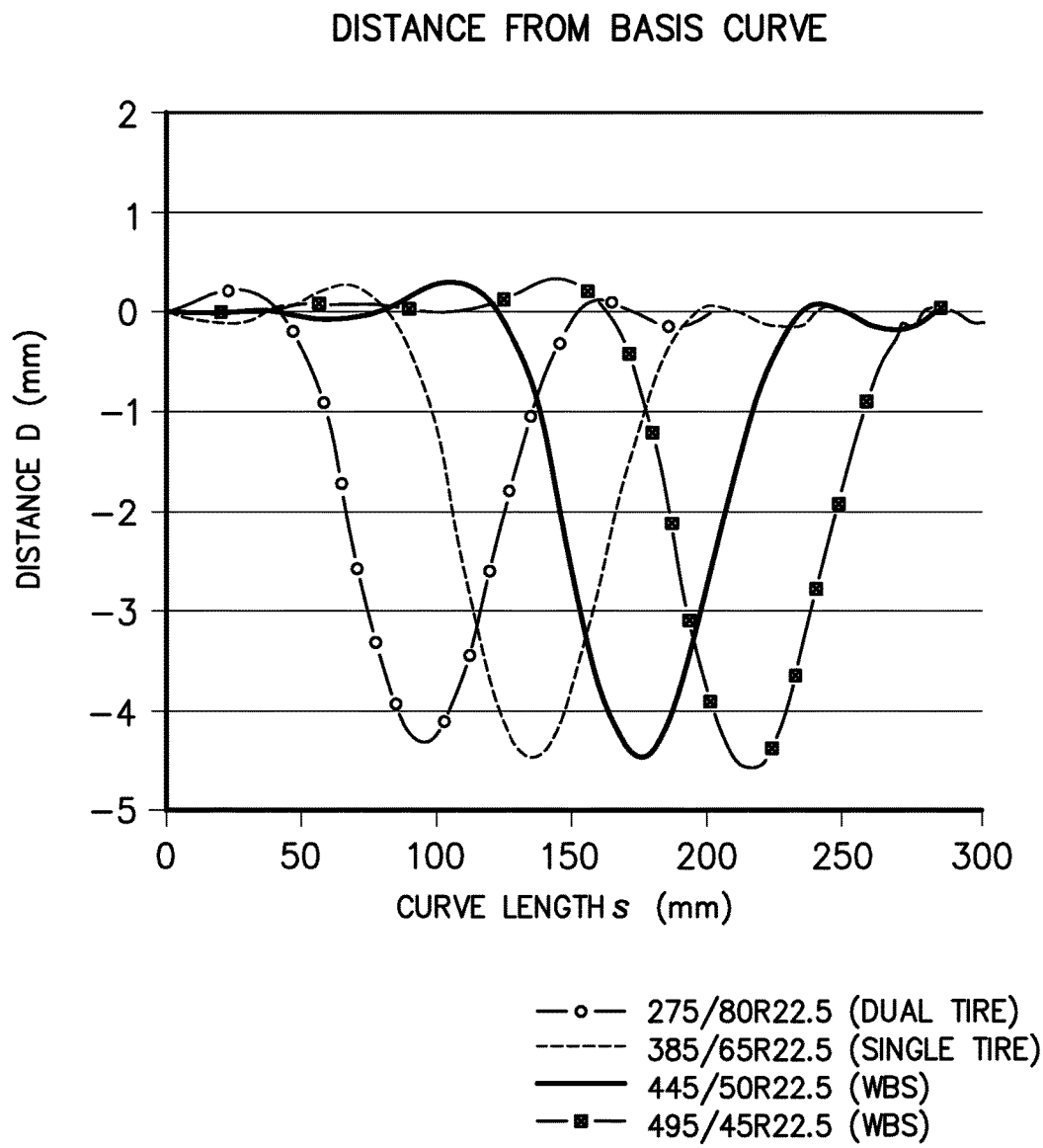
FIG. -9-

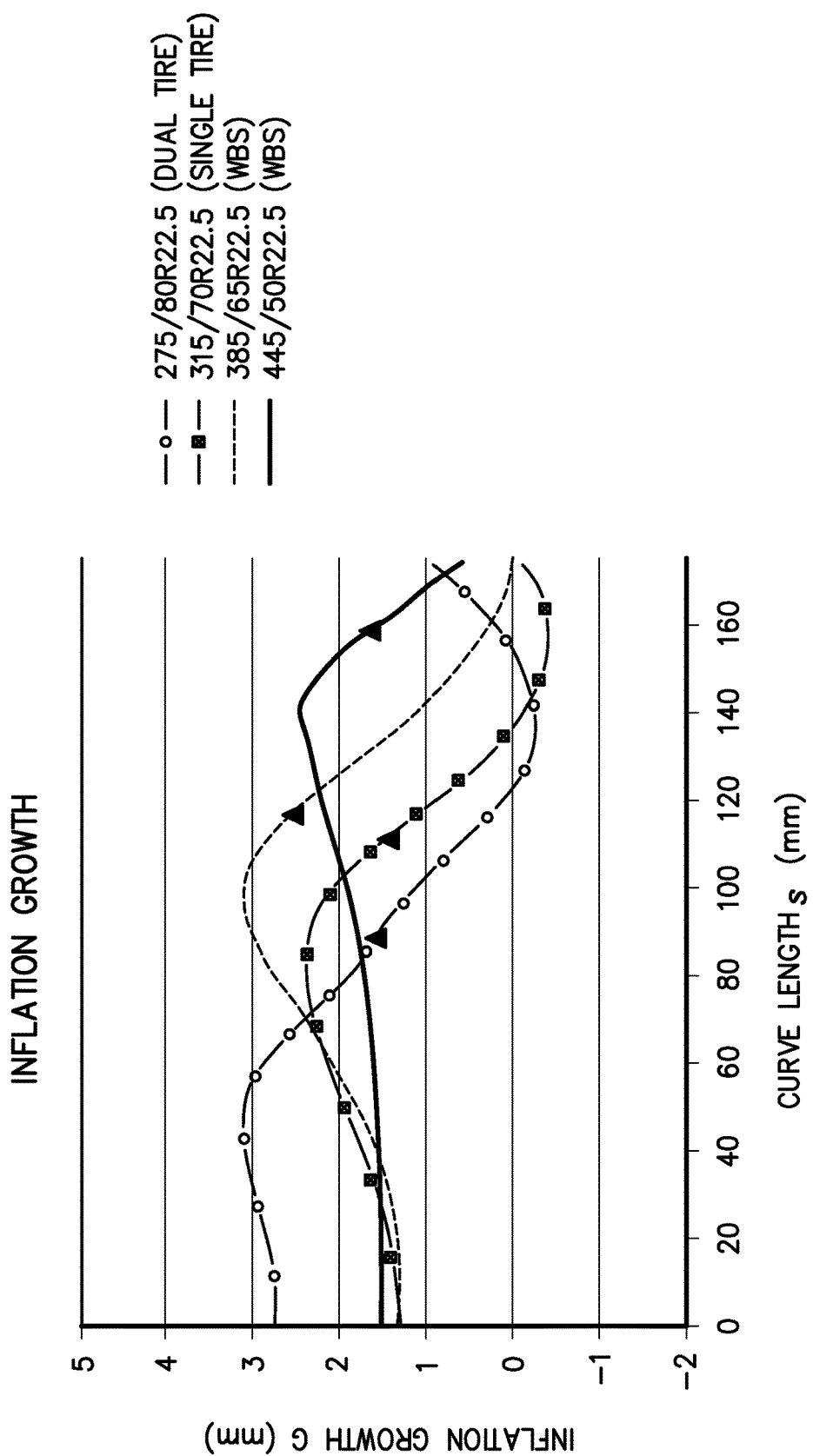
FIG. -10-

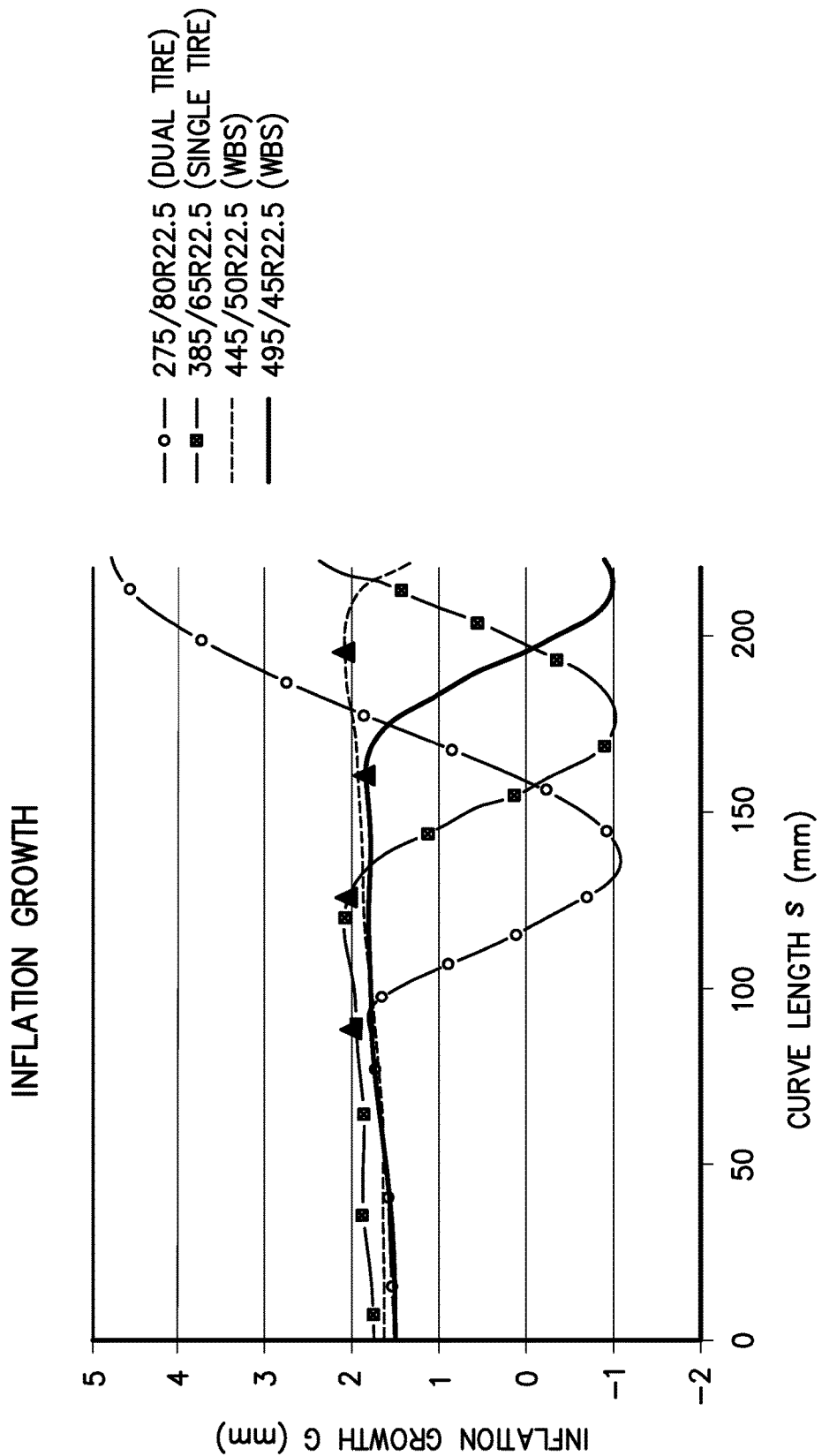
FIG. -11-

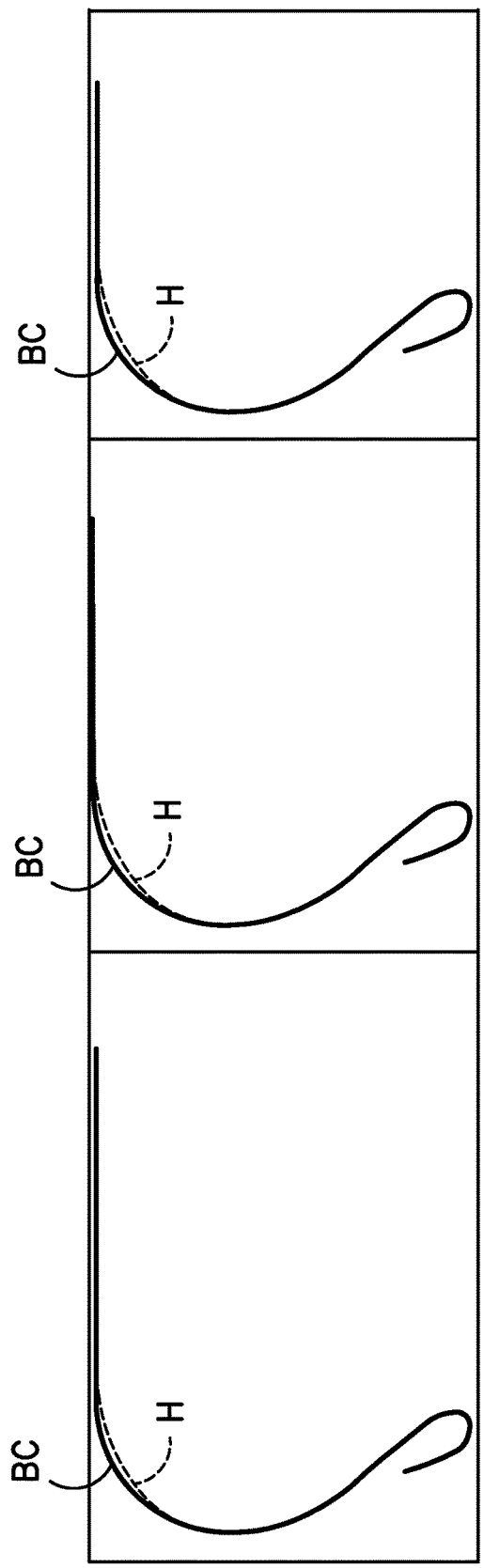
FIG. -12-

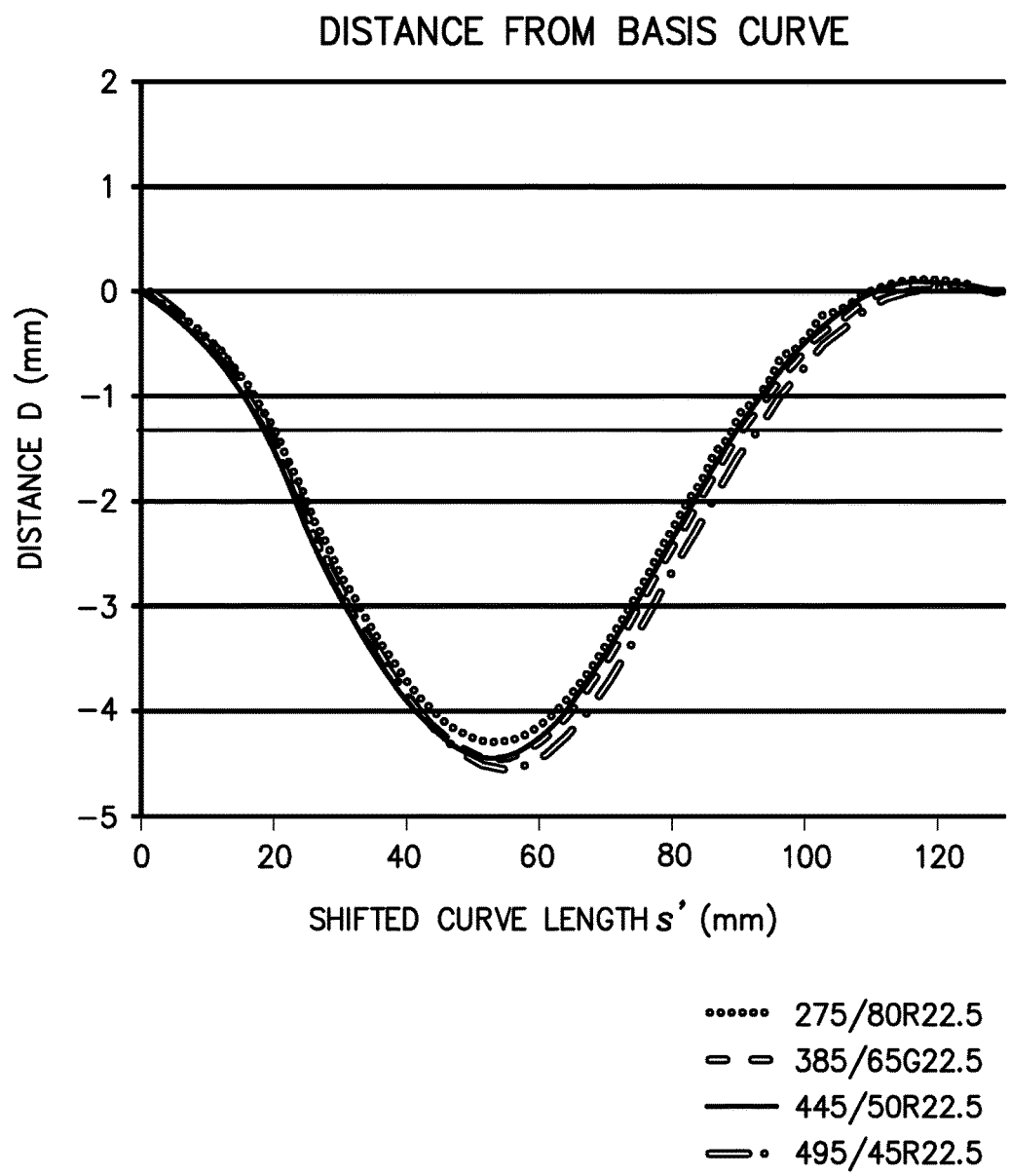
FIG. -13-

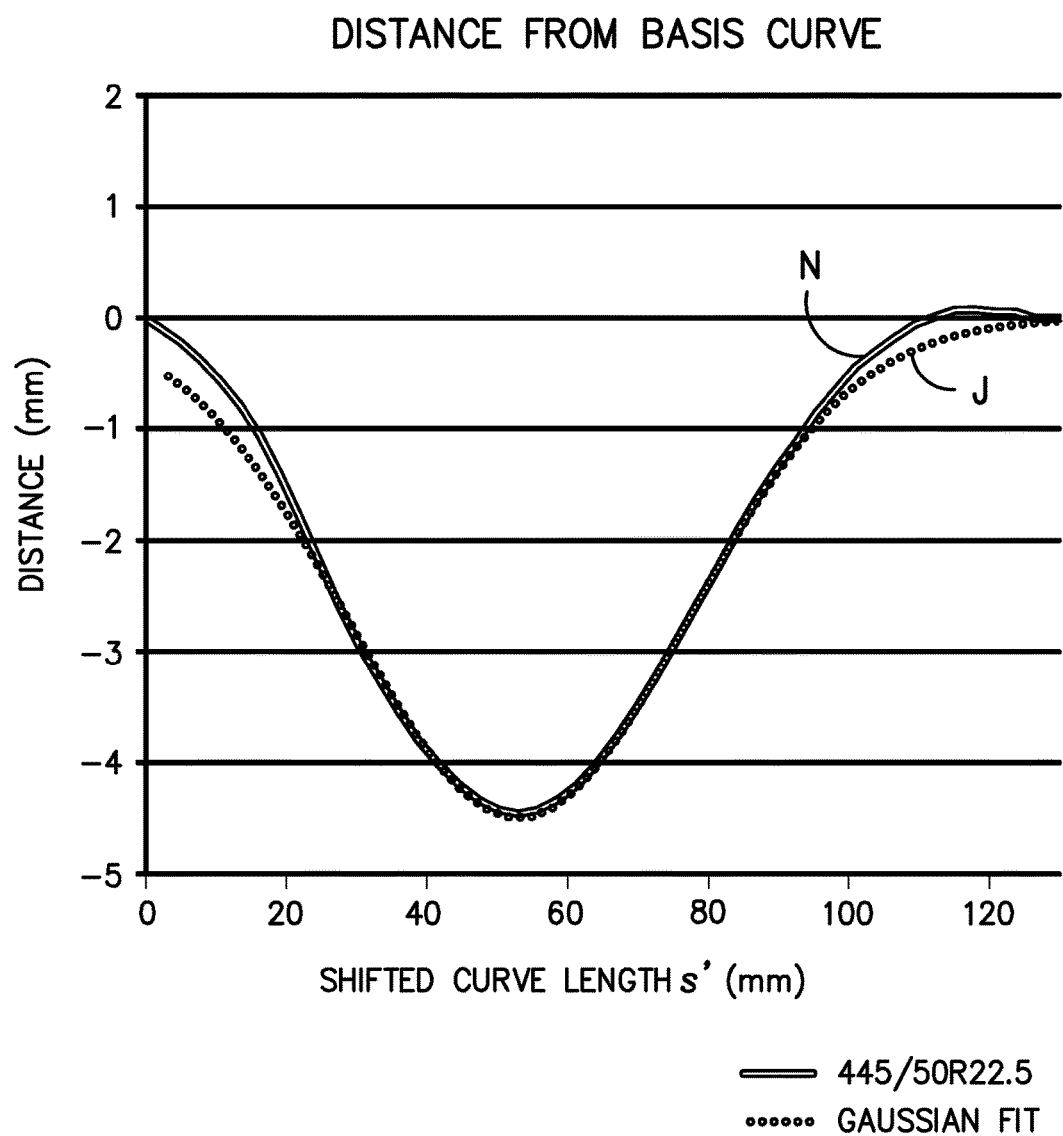
FIG. -14-

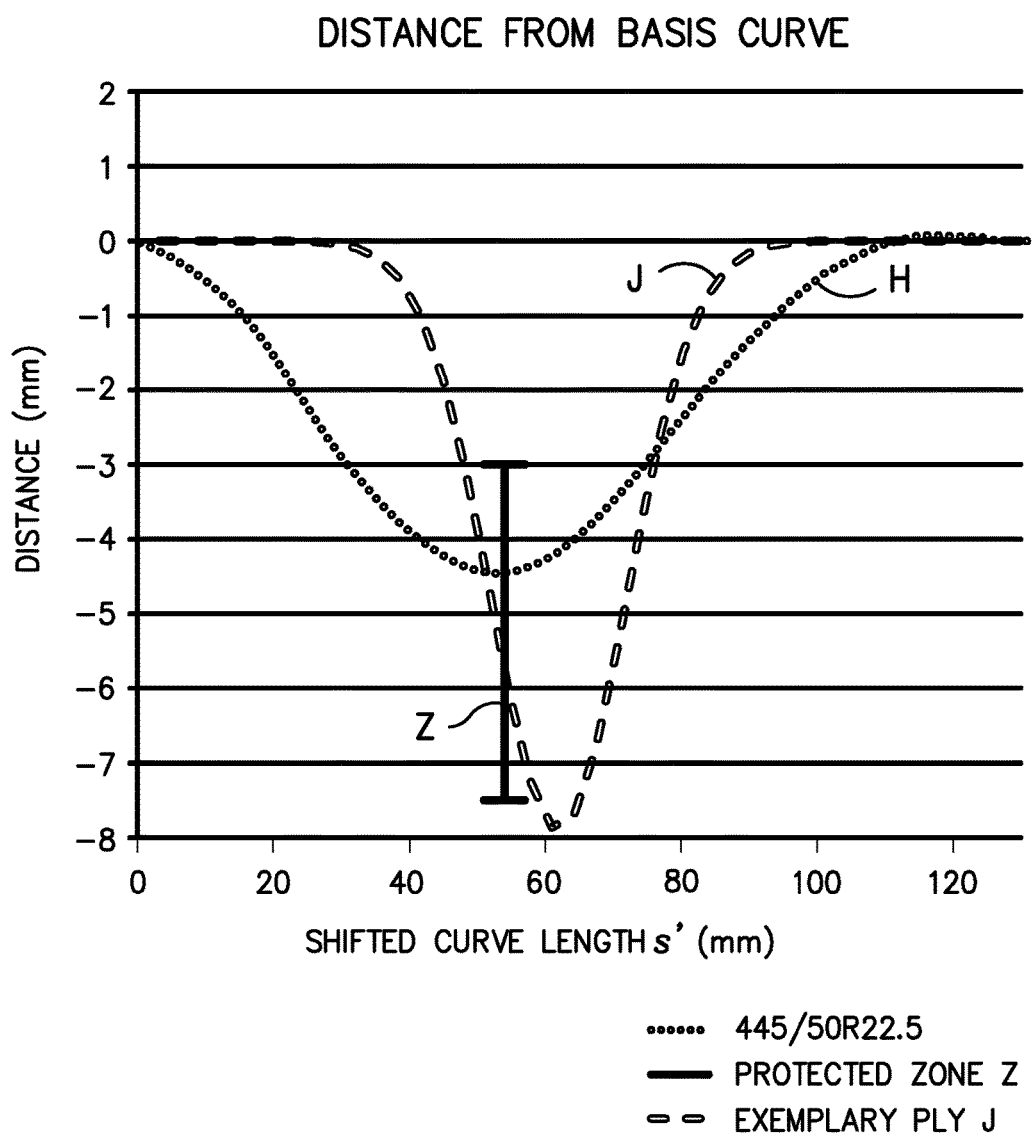
FIG. −15−

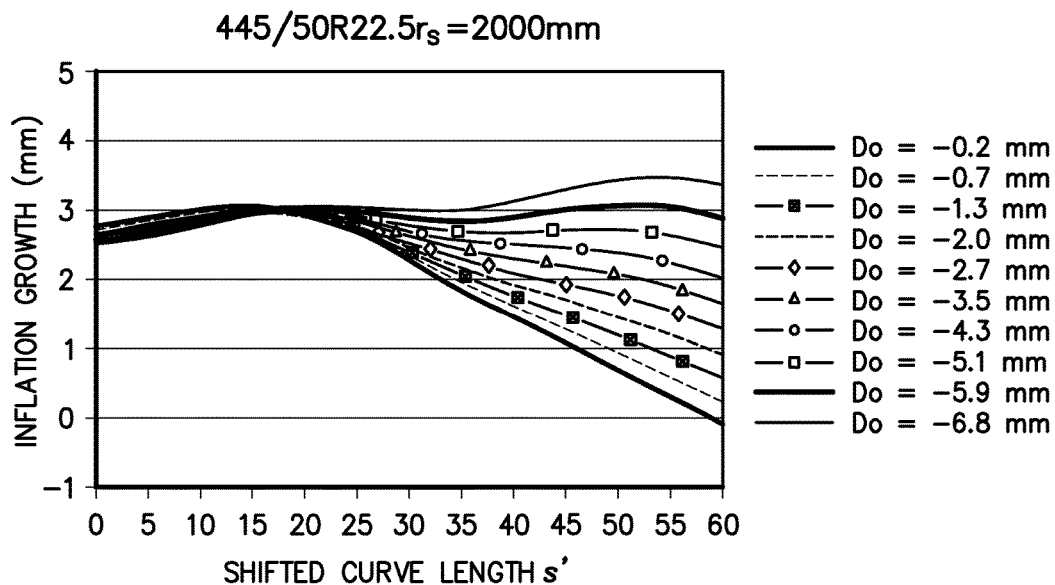
FIG. -16-
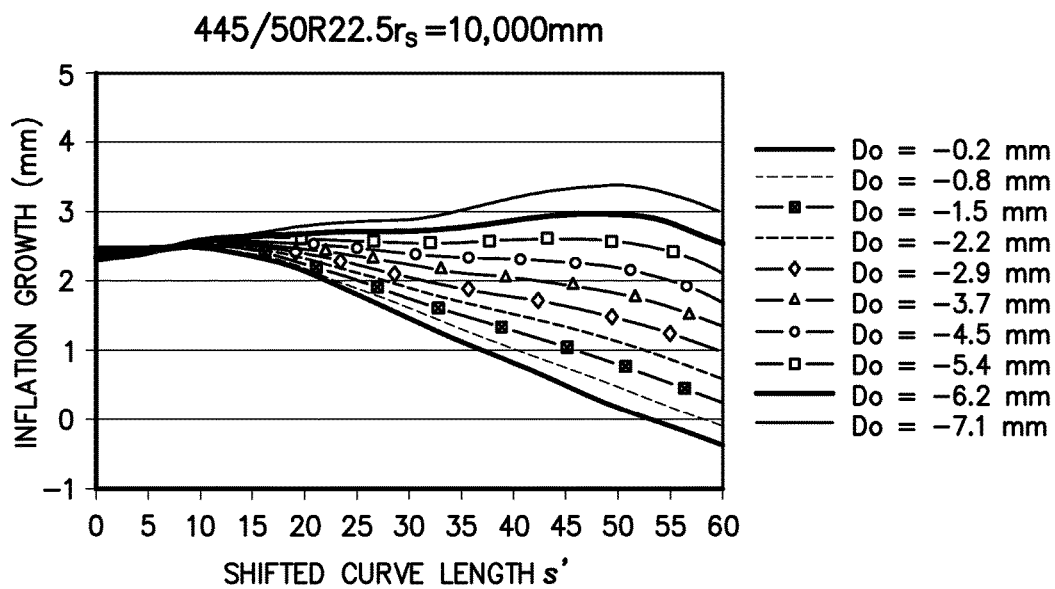
FIG. -17-

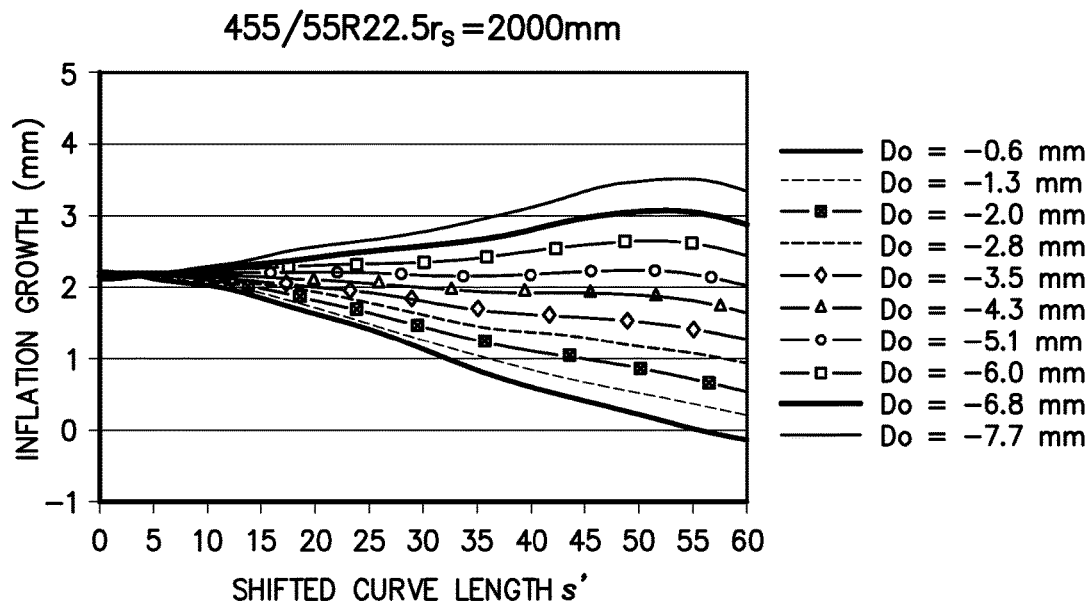
FIG. -18-
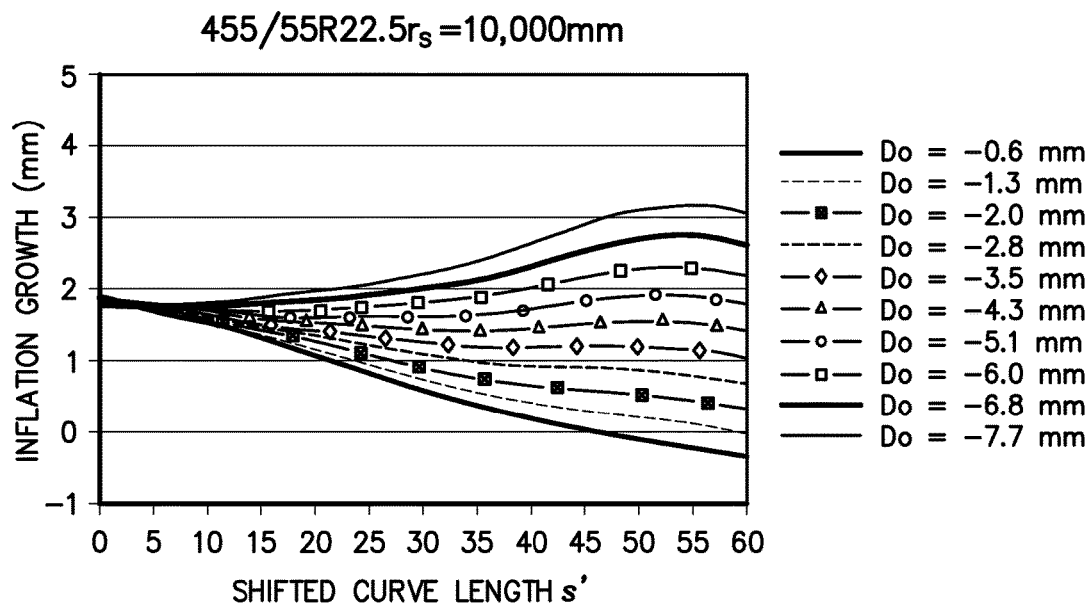
FIG. -19-

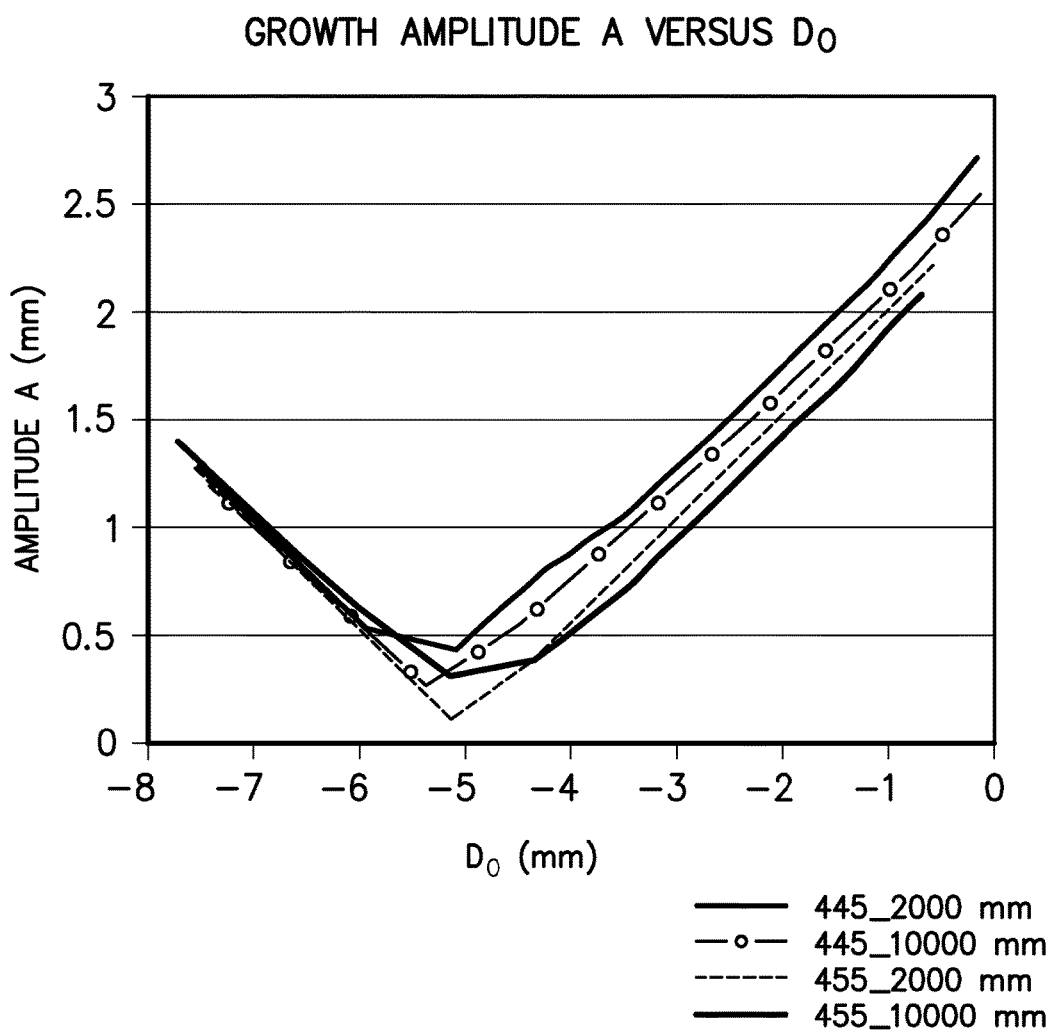
FIG. -20-

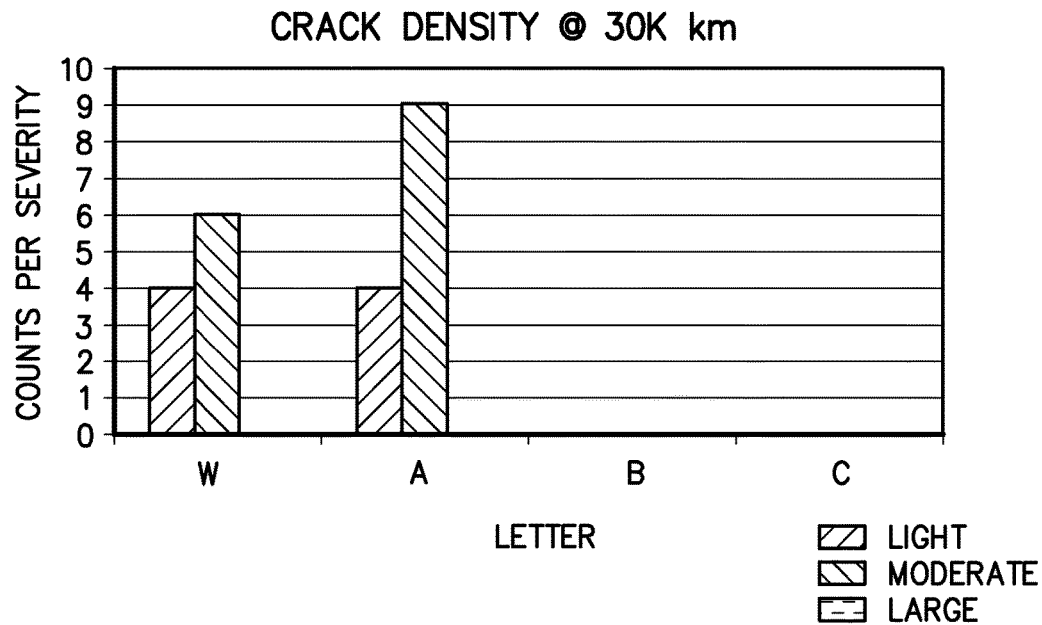
FIG. -21-
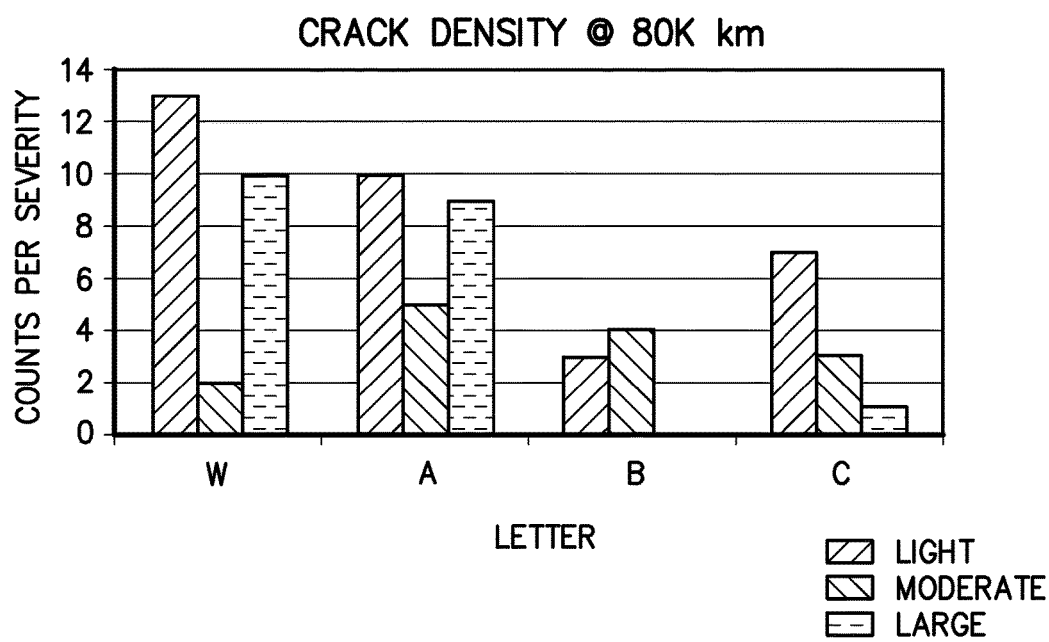
FIG. -22-

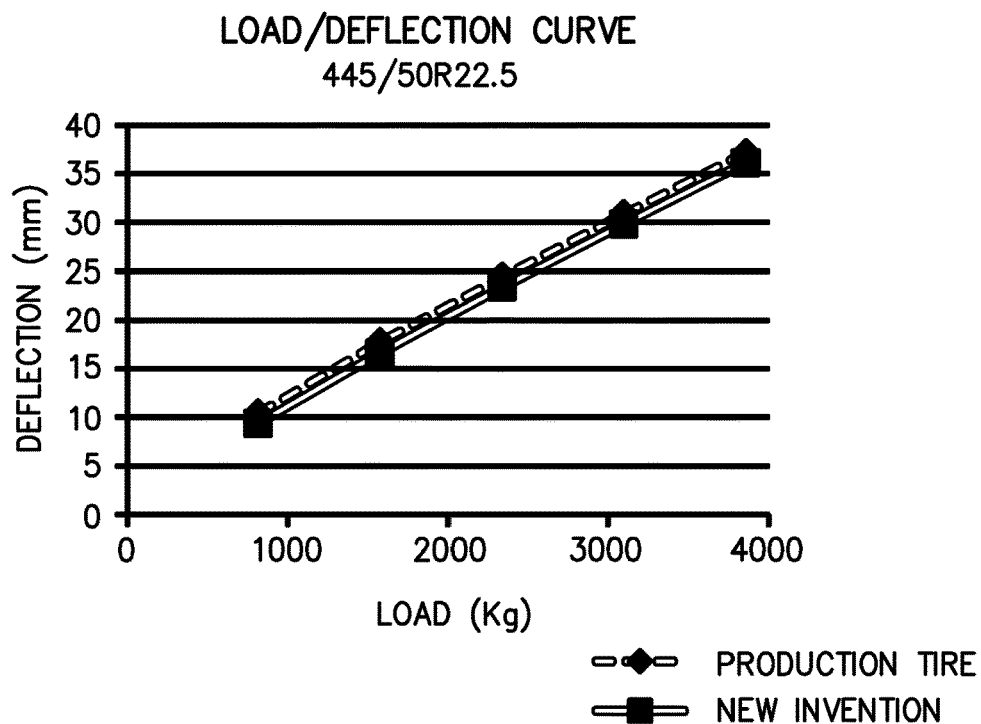
FIG. -23-
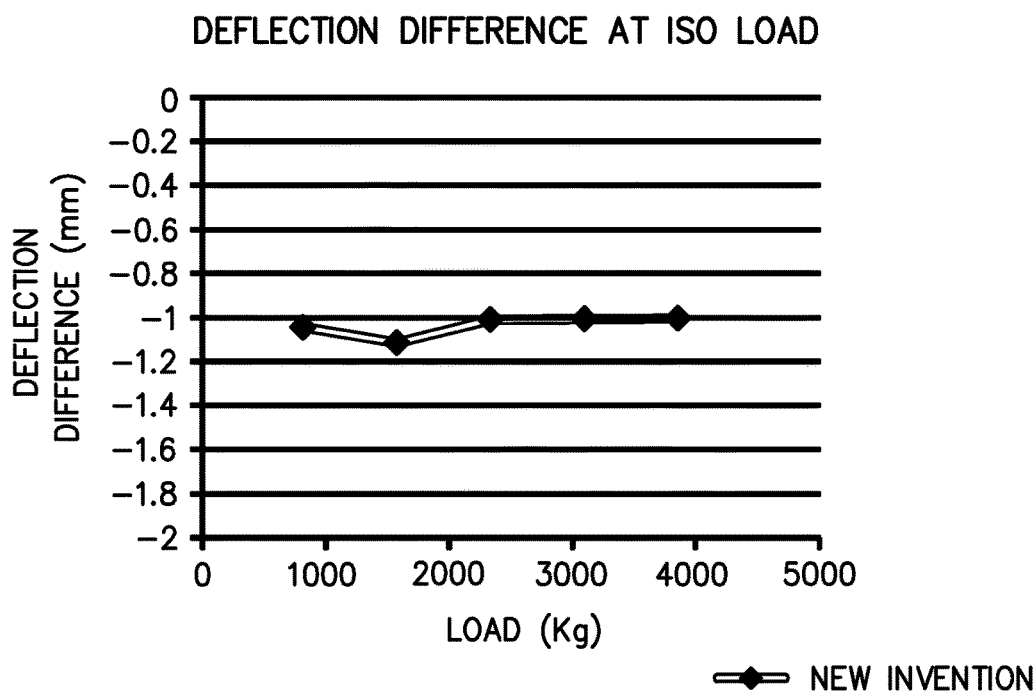
FIG. -24-

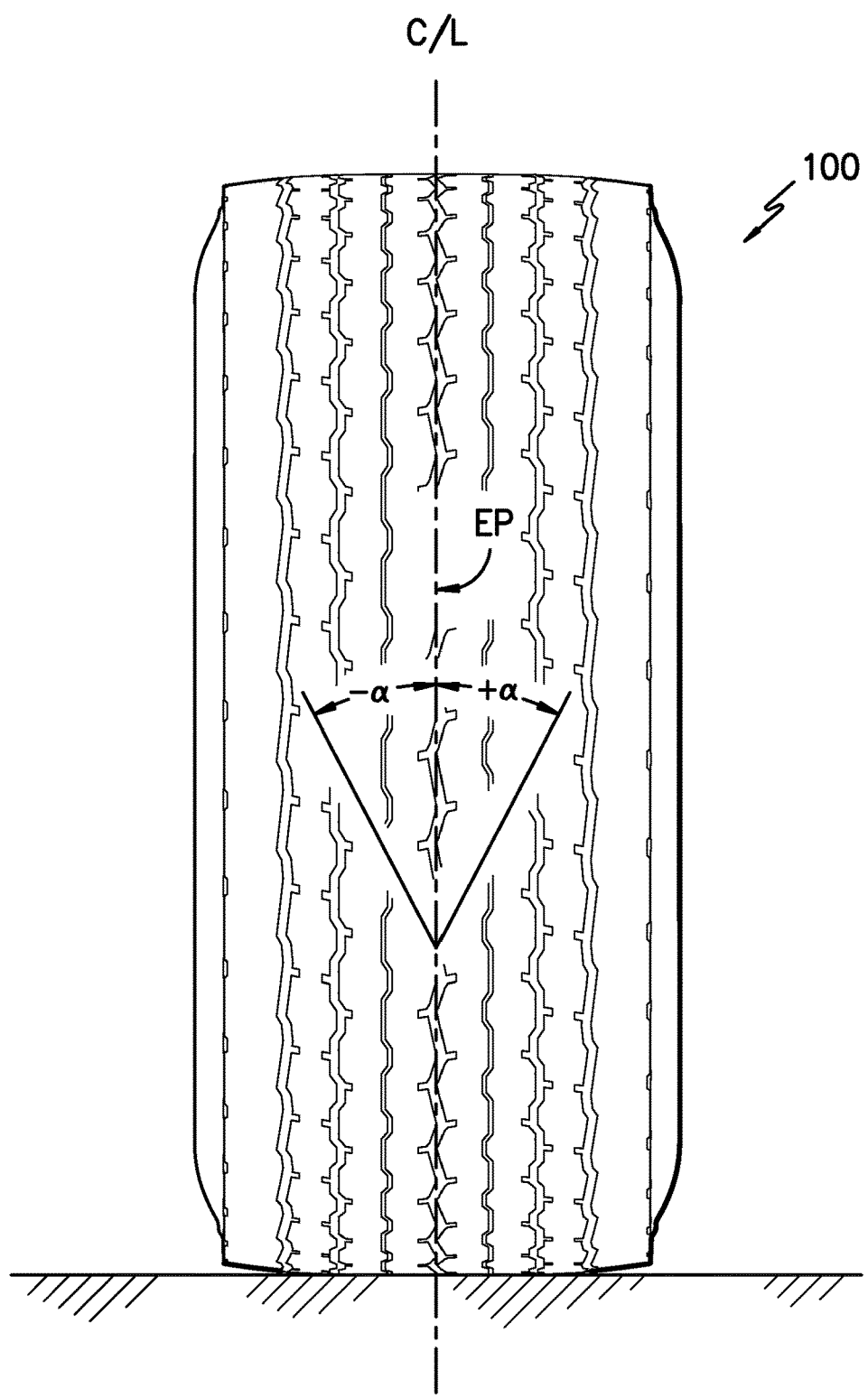
FIG. -25-

BODY PLY SHAPE FOR A TIRE

FIELD OF THE INVENTION

The subject matter of the present disclosure relates generally to a novel shape for the body ply, or carcass, of a tire including a wide-based single tire.

BACKGROUND OF THE INVENTION

The body ply of a tire, also referred to sometimes as the carcass or carcass ply, extends from the bead portions, through both opposing sidewall portions, and the crown portion of the tire. One or more layers that include substantially inextensible materials referred to e.g., as cords are typically used in its construction. For a radial tire, these cords are typically oriented at greater than about 80 degrees as measured from an equatorial plane of the tire. In a pneumatic tire, the body ply helps constrain inflation pressure and determine the overall shape of the tire upon inflation. When the tire is inflated to a given pressure, the body ply will assume a particular shape or profile in the meridian plane that is referred to as the equilibrium curve.

Body ply design poses a challenge for all tires and particularly for wide-based single (WBS) tires, which are tires that typically have a relatively wide crown portion and may be used to replace a pair of tires each having a relatively narrow crown portion. All tires, particularly WBS tires, commonly have a difference in rigidity between the center of the tire and the shoulder region. This difference can be particularly pronounced as compared with either of the dual conventional tires that a single WBS tire replaces. The difference in rigidity can lead to uneven growth of the tire as it is inflated including differences in growth along the crown portion where the tread is located. As a result, the tire can experience enhanced motion of the shoulders compared with the center when the tire is rolling, which can create issues such as groove bottom cracking in the tread and an enhanced sensitivity of the contact patch shape to load variations.

Conventionally, the equilibrium curves used for tire design and construction are based upon a traditional three-ply membrane model. Unfortunately, because of the large difference in rigidity between the center and the shoulder region of the tire, particularly a WBS tire, this traditional model can yield a tire with uneven inflation growth. Again, this uneven inflation growth can create a flex point in shoulder of the tire, which can place large stresses on shoulder groove bottoms and reduce the rigidity of the shoulder region relative to the center of the tire.

Previous attempts to achieve even inflation growth have focused on e.g., adding structural stiffness to the belt package in the crown portion so as to mechanically restrain unwanted inflation growth. Unfortunately, this approach increases the cost of the tire as well as the mass of the tire. Increased mass can adversely affect tire performance such as rolling resistance.

Accordingly, a tire employing a body ply that provides for more uniform inflation growth would be useful. Such a tire that can have less differences in rigidity between the center and shoulders would be beneficial. Having these features in a tire such as e.g., a WBS tire that can also prevent or deter e.g., groove bottom cracking in the tread, decrease sensitivity to load variations, and/or provide other benefits would be useful. Achieving these advantageous benefits without increasing the mass or deleteriously affecting the rolling resistance or other performance criteria would be particularly beneficial. A method of creating or designing such a tire would also be useful.

SUMMARY OF THE INVENTION

The present invention provides a tire having uniform inflation growth in the crown region of the tire. More particularly, the tire is provided with a body ply that is displaced from the conventional equilibrium curve along the shoulder and upper side wall region of the tire in a manner that provides more uniform inflation growth along the crown region so as to reduce differences in rigidity between the center and shoulders of the tire, reduce load sensitivity, and/or decrease the propensity for cracking—particularly along a groove bottom of the tread in the shoulder. These improvements can be provided without increasing the mass of the tire or deleteriously affecting certain other performance factors such as rolling resistance. Instead, the improvement can be obtained by changes to the geometry (i.e. shape or profile) in the meridian plane of the body ply of a tire. A method for designing or constructing such a tire is also provided by the present invention. Additional objects and advantages of the invention will be set forth in part in the following description, or may be apparent from the description, or may be learned through practice of the invention.

In one exemplary embodiment of the present invention, a tire is provided. The tire defines a radial direction, an axial direction, and a tire centerline. The tire includes a pair of opposing bead portions; a pair of opposing sidewall portions connected with the opposing bead portions; a crown portion connecting the opposing sidewall portions; a body ply extending between the bead portions and through the sidewall and crown portions, the body ply having a curve along a meridian plane, wherein s is the length in mm along the curve from centerline of the tire. The tire also has one or more belt plies positioned in the crown portion, wherein $s_M$ is one-half of the maximum curvilinear width, along the axial direction, of the widest belt of the one or more belt plies. When a basis curve is constructed for the body ply, the body ply is located radially inward of the basis curve along at least one side of the tire centerline with a deviation D(s), with $-7.5 \text{ mm} \leq D(s) \leq -3$ mm at a point $s_b+54$ mm along the curve of the body ply, and where $s_b$ is equal to $s_M-60$ mm. Negative values for D(s) denote that the body ply is located radially inward of the basis curve for such values.

For this exemplary embodiment, the tire may have an inflation growth amplitude A that is less, or equal to, about 1.25 mm when the tire is inflated from a pressure of about 0.5 bar to about the maximum sidewall pressure. The exemplary tire may have a crown radius of greater than, or equal to, about 2000 mm. By way of additional example, this exemplary tire may have a crown radius of greater than, or equal to, about 3000 mm. The one or more belt plies may include a plurality of belt plies. When the body ply is represented by a curve C(s) in the meridian plane and L is the body ply half-length, L may be in the range of about 60 mm to about 222 mm. The least one belt ply may have e.g., a belt width in meridian plane in the range of about 102 mm to about 222 mm. For this exemplary tire, when a basis curve is constructed for the body ply, along both sides of the tire centerline the body ply may be located radially inward of the basis curve with a deviation D(s), where $-7.5 \text{ mm} \leq D(s) \leq -3$ mm at a point $s_b+54$ mm along the profile of the body ply, where $s_b$ is equal to $s_M-60$ mm. This exemplary tire may have an aspect ratio in the range of 50 or 55. This exemplary tire may have a section width in the range of 445 mm to 455 mm. The basis curve may be constructed at a reference pressure of 0.5 bar.

In another exemplary aspect, the present invention provides a method of tire construction. The tire can include, for example, a pair of opposing bead portions, a pair of opposing sidewall portions connected with the opposing bead portions, a crown portion connected with, and extending along an axial direction between, the opposing sidewall portions, at least one body ply extending between the bead portions and through the crown portion and sidewall portions, at least one belt ply located in the crown portion, the at least one belt ply being the widest belt ply along the axial direction of the tire. This exemplary method of tire construction can include the steps of creating a model of the tire that includes a reference curve representing the shape of the body ply along a meridian plane when the tire is inflated to a reference pressure, wherein s is a length in mm along the reference curve from a centerline of the tire; constructing a basis curve for the tire based upon the reference curve of the tire at the reference pressure; creating a target reference curve for the shape of the body ply along the meridian plane by repositioning the reference curve to have a deviation $D(s)$ from the basis curve, and wherein $-7.5 \text{ mm} \leq D(s) \leq -3 \text{ mm}$ on at least one side of the tire centerline at a point $s_b+54$ mm along the curve of the body ply, where $s_b$ is equal to $s_M-60$ mm and $s_M$ is one-half of the maximum curvilinear distance along the axial direction of the widest belt ply.

For this exemplary method of tire construction, the step of creating a model of the tire may include determining the reference curve using finite element analysis. The step of creating a model of the tire may include subjecting a physical specimen of the tire to measurement of the body ply. The step of creating a model of the tire may include subjecting a physical specimen of the tire to X-ray of the body ply. In another exemplary aspect, when the body ply is positioned according to the target reference curve, the tire may have an inflation growth amplitude A that is less, or equal to, about 1.25 mm when the tire is inflated from a pressure of about 0.5 bar to about its maximum sidewall pressure.

For this exemplary method, the creating step may include repositioning the reference curve to have a deviation $D(s)$ from the basis curve, and wherein $-7.5 \text{ mm} \leq D(s) \leq -3 \text{ mm}$ on both sides of the tire centerline at a point $s_b+54$ mm along the profile of the body ply, where $s_b$ is equal to $s_M-60$ mm and $s_M$ is one-half of length L. The tire may have a crown radius of greater than, or equal to, about 2000 mm.

This exemplary method can further include the step of manufacturing the tire with the body ply having a geometry according to the target reference curve.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a view of a cross-section of an exemplary embodiment of a tire of the present invention. The cross-section is taken along a meridian plane of the tire and is not necessarily drawn to scale.

FIG. 2 illustrates cross-sectional views of an exemplary body ply of the present invention and a conventional body ply. Only one half of the curve representing each body ply is shown—i.e. the portion of the curve along one side of the tire centerline.

FIG. 3 is a cross-sectional view of one-half of a body ply or curve used in defining certain terms herein.

FIG. 4 is a cross-sectional view of two curves used in describing the inflation growth of a body ply.

FIG. 5 is a cross-sectional view illustrates the change in the shape of a body ply when inflated between a reference pressure and a nominal pressure.

FIG. 6 is a plot of inflation growth of a conventional body ply relative to an exemplary body ply of the present.

FIG. 7 is a cross-sectional view of one-half of a reference curve and the longest (i.e. widest along the axial direction) belt ply of an exemplary tire. The construction of a basis curve is also depicted.

FIG. 8 is a plot of the distance of the body ply from a respective basis curve BC for each of four conventional, commercial tires as indicated in the legend.

FIG. 9 provides a plot, based on FEA (finite element analysis) simulations, of the distance $(D_{RX}(s))$ of an exemplary new body ply H of the present invention from the basis curve for four tires with sizes as indicated in the legend.

FIG. 10 is a plot of inflation growth $(G(s))$ for the tires of FIG. 8 illustrating the non-uniform inflation growth of a conventional body ply.

FIG. 11 is a plot of inflation growth $(G(s))$ for the tires of FIG. 9 illustrating, for each exemplary tire, the uniform inflation growth in the crown portion resulting from the inventive body ply of the present invention.

FIG. 12 is a comparison of the cross-sectional views of one half of a body ply for each of three tires having different tire widths.

FIG. 13 is a plot of the distance (i.e. deviation) from the basis curve as function of s' for four different tire sizes where each tire is modeled with an inventive body ply of the present invention.

FIG. 14 provides plots of the distance from the basis curve as function of s' for Gaussian fit and an exemplary body ply.

FIG. 15 illustrates plots of the distance from the basis curve as function of s' for a computer simulated exemplary body ply H and another example of an exemplary body ply J, both of which pass cross through the protected zone defined in this patent.

FIGS. 16, 17, 18, and 19 illustrate certain experimental data derived from computer models as more fully described herein.

FIG. 20 is a plot of growth amplitude A as a function of $D_o$ as more fully described herein.

FIGS. 21, 22, 23, and 24 depict certain experimental data as more fully described herein.

FIG. 25 is a front view of an exemplary tire as may be equipped with an exemplary body ply of the present invention.

DETAILED DESCRIPTION

For purposes of describing the invention, reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention covers such modifications and variations as come within the scope of the appended claims and their equivalents.

As used herein, the following definitions apply:

"Meridian plane" is a plane within which lies the axis of rotation of the tire. FIG. 1 is a cross-section of an exemplary tire 100 of the present invention taken along a meridian plane. As used herein, the meridian plane includes the y-z plane of a Cartesian coordinate system where y=0 is located along the centerline C/L of the tire.

The "center line" (C/L) of the tire is a line that bisects the tire, as viewed in the meridian plane, into two halves.

"Equatorial plane" is a plane perpendicular to the meridian plane that bisects the tire along its center line (C/L). As used herein, the equatorial plane includes the x-z plane of a Cartesian coordinate system.

The "crown portion" of the tire is the portion that extends along the axial direction A (which is the direction parallel to the axis of rotation of the tire) between the sidewall portions of the tire including the tread and components positioned radially inward of the tread.

"Body ply" or "carcass" or "carcass ply" is a ply that extends between and from the bead portions on opposing sides of the tire, through the opposing sidewall portions, and across the crown portion of the tire. As used herein, a body ply has reinforcements such as e.g., cords that are at an angle of 10 degrees or less from the meridian plane.

"Belt ply" is a ply located primarily in the crown portion, radially inward of the tread portion, and radially outward of the body ply. A belt ply does not extend past shoulder portions of a tire.

"Equilibrium curve" refers to a model of the shape or geometry of a body ply as viewed in the meridian plane of the tire. The tire, including the body ply, will assume an equilibrium shape when mounted onto a wheel or rim and inflated. An equilibrium curve can be used e.g., to model the shape of the body ply in this equilibrium condition.

"Maximum sidewall pressure" means the maximum inflation pressure of the tire that is typically marked on the tire's sidewall.

The "radial direction" is perpendicular to the axis of rotation of the tire. A Cartesian coordinate system is also employed in the following description where the y-axis is parallel to the axis of rotation and the z-axis is parallel to the radial direction.

Tires sizes are referred to herein according to conventions published and used by the Tire and Rim Association as will be understood by one of skill in the art.

The use of terms such as belt, bead, and/or ply herein and in the claims that follow does not limit the present invention to tires constructed from semi-finished products or tires formed from an intermediate that must be changed from a flat profile to a profile in the form of a torus.

FIG. 1 provides a cross-section along a meridian plane of an exemplary embodiment of a tire 100 of the present invention. Tire 100 includes a pair of opposing bead portions 102, 104. A pair of opposing sidewall portions 106, 108 are connected with the opposing bead portions 102, 104. A crown portion 110 connects the opposing sidewall portions 106, 108. One or more belt plies 112, 114, and 116 are positioned in crown portion 110. Belt plies 112, 114, and 116 are layers reinforced with elements such as cords 118, 120, and 122—the cords of each layer forming the same or different angles with the equatorial plane or the x-z plane (i.e. the equatorial plane EP).

At least one exemplary body ply H of the present invention extends between the bead portions 102, 104, passing through opposing sidewall portions 106, 108 and crown portion 110. The body ply contains elements oriented at angles from the meridian plane typically of 10 degrees or less. A tread portion 124 is located in the crown portion 110 radially outward of the belt plies 112, 114, and 116. Tread portion 124 includes ribs 126 separated by grooves such as first groove 128 and 130 along each shoulder portion 132 and 134. It should be noted that the present invention is not limited to the particular size or appearance of tire 100 shown in FIG. 1. Instead, the present invention may also be used with tires having e.g., different widths, aspect ratios, tread features, and belts from what is shown in FIG. 1—it being understood that tire 100 is provided by way of example only. Additionally, the present invention is not limited to body ply having an upturn around a bead core as shown bead portions 102, 104.

As stated above, the present invention provides a tire having a more uniform inflation growth—i.e. the growth of the tire as it is inflated—along the entire crown portion 110 of the tire. Such uniform growth reduces differences in rigidity between the center and shoulders of tire 100 reduces load sensitivity, and/or decreases the propensity for cracking—particularly along one or more groove bottoms in e.g., grooves 128 and/or 130 of the tread portion 124 of tire 100.

In a typical tire manufacturing process, tires are cured in a mold where they take on their final geometry. Conventionally, the body ply is typically designed to be as close to equilibrium as possible in the mold for ease of manufacturing. For the present invention, an inventive body ply H (of which the body ply H in FIG. 1 is one example) is provided that deviates from the conventional equilibrium curve—i.e. the conventional geometry for the body ply. It has been found that this inventive deviation compensates for a structural effect, typical of a reinforced composite, that occurs near the end of the belts in the shoulder portion 132 and/or 134 of the tire. In addition, the inventors discovered that by positioning body ply H such that it deviates, i.e. is displaced from, a conventional equilibrium curve in a particular manner along the shoulder and upper sidewall portions, uniform inflation growth is achieved. As shown by way of example in FIG. 2 and to be described more particularly herein, this new body ply H differs substantially from a conventional body ply P (modeled using a conventional equilibrium curve).

As used herein, the term "inflation growth" can be understood more fully with reference to the difference between two curves. More particularly, assume that R is a reference curve denoting the shape of a body ply in the meridian plane, that X is another curve denoting the shape of another body ply in the meridian plane, and that $D_{RX}$ designates the distance of curve X from curve R along a direction towards curve X from curve R that is normal to curve R at any given point. Assume also that curves R and X are coplanar and lie in the same y-r plane in the well-known polar, cylindrical coordinate system. Curves R and X can be specified in the Cartesian y-z plane because any y-r plane can be rotated into the y-z plane—i.e. the meridian plane as defined herein.

With reference to FIG. 3, reference curve R can be parameterized as a function of its curve length s by defining $\vec{R} = \vec{R}(s) = [y(s), z(s)]$. Let $s \in [0, L]$, where L is the total length of the curve R from s=0 (as reference curve R can represent a body ply, L is also referred to herein as the body ply half-length). This curve has tangent vector $$\vec{t}_R = \frac{\partial \vec{R}}{\partial s} = \left[\frac{\partial y}{\partial s}, \frac{\partial z}{\partial s}\right]$$

and normal vector $$\vec{n}_R = \left[\frac{\partial z}{\partial s}, -\frac{\partial y}{\partial s}\right].$$

The distance between $D_{RX}(s_0)$ between the curve R at the point $R(s_0)$ and curve X is defined in the following manner as illustrated in FIG. 4:
1. Locate the point $R(s_0)$ and calculate the normal to the curve $\vec{n}_R(s_0)$ at this point.
2. Create a ray collinear to $\vec{n}_R(s_0)$ that passes through $R(s_0)$. This ray will intersect the curve X at a set of points $\{q_i\}$.
3. Define $D_{RX}(s_0)$ as $D_{RX}(s_0) \equiv \min_i \|q_i - R(s_0)\|$. This ensures that the closest point will be chosen if the normal ray intersects curve X at more than one point.

Accordingly, if curve X represents the body ply H of exemplary tire 100 after inflation and reference curve R represents the body ply H before such inflation, then the inflation growth at a point can be determined as $D_{RX}(s_0) \equiv \min_i \|q_i - R(s_0)\|$ as set forth above. As an example, if tire 100 is cut in the y-z plane (i.e. the meridian plane), body ply H will define a curve C that can be parameterized as a function of its curve length s: $\vec{C} = \vec{C}(s) = [y(s), z(s)]$. Curve C has tangent vector $$\vec{t}_C = \frac{\partial \vec{C}}{\partial s} = \left[\frac{\partial y}{\partial s}, \frac{\partial z}{\partial s}\right]$$

and normal vector $$\vec{n}_C = \left[\frac{\partial z}{\partial s}, -\frac{\partial y}{\partial s}\right].$$

Similarly, the interior surface I and exterior surface E of tire 100 can also be described by curves $I(s_1)$ and $E(s_2)$ with normal vectors $\vec{n}_I$ and $\vec{n}_E$, respectively.

Using these definitions, in one exemplary method of the present invention, inflation growth can be measured between a very low pressure state (referred to herein as the "reference pressure") and the desired design pressure of the tire (referred to herein as the "nominal pressure"—which could be e.g., the maximum sidewall pressure). Preferably, the reference pressure is high enough to seat a bead portion 102, 104 of tire 100 on a wheel rim but low enough to avoid otherwise changing the shape of tire 100. More particularly, to keep the boundary conditions unchanged between these two pressure states, for this exemplary method, the position of the bead portion 102, 104 of the tire 100 on the rim is fixed in the position it occupies at the nominal pressure. Such can be accomplished experimentally through the use of an internal bead support, for example, and can also be easily simulated or modeled with e.g., a computer using finite element analysis (FEA).

Next, measurements of tire 100 are made that yield the curves I, E and/or C at any desired azimuth. For example, the curve C(s) for body ply H can be measured directly (e.g., by x-ray techniques) or obtained from a computer model by FEA. As illustrated in FIG. 5, the two body ply curves obtained with the above specified boundary conditions can be defined as $C(s)^N$ (the body ply curve at the nominal pressure) and $C(s)^R$ (the body ply curve at the reference pressure). The inflation growth $G(s_0)$ of the body ply at a point $s_0$ is then defined as $G(s_0) \equiv D_{C^R C^N}(s_0)$.

FIG. 6 illustrates the results of applying this exemplary method for measuring inflation growth to a conventional 445/50R22.5 WBS tire using FEA at a reference pressure of 0.5 bar and a nominal pressure of 8.3 bar. With y=0 at the tire centerline, the tread band for this conventional tire extends from −195 mm (millimeters) to +195 mm. Only one side of the tire (i.e. to the left of the centerline C/L) is shown, it being understood that the results would be substantially symmetrical for a tire constructed symmetrically about the tire centerline. The lines b and M' are further described later.

As shown by curve U in FIG. 6, the 445/50R22.5 WBS tire with a conventional body ply experienced uneven or non-uniform inflation growth across the crown portion of the tire. A large peak is visible at approximately 142 mm, with a corresponding peak located symmetrically on the other side of the centerline (not shown). Unfortunately, these large peaks align closely with the position of the first shoulder groove 128 or 130 of tread portion 124 and place the respective groove bottom under strong tensile extension, which can greatly facilitate crack nucleation and propagation. Such strong growth, coupled with the sharp decrease in growth at the edge of the tread portion 124, can act to bend the crown portion 110 of the tire in the location of the groove 128 or 130. In turn, this introduces a hinge point into the crown portion 110 of the tire, in which the tire bends structurally rather than acting pneumatically, thereby reducing the tire's overall vertical rigidity. This hinge point occurs with or without the presence of a shoulder groove but can be particularly problematic when it coincides with the location of a groove.

Because the degree of bending at this hinge point is a function of load, the tire's footprint can experience rapid evolution at the shoulders 132 and 134 relative to the center line C/L of the tire as the load changes. For example, at high loads the shoulders 132 and 134 can have too much length in contact with the ground relative to the center. Conversely, at lower loads the shoulders 132 and 134 can become too short relative to the center and may even lose contact with the ground entirely at the lowest usage loads. Known as load sensitivity, this phenomenon is undesirable for the even and regular wear of the tread and can result in reduced removal mileage for the tire.

In contrast, the present invention solves this problem by providing for a flat and stable inflation growth curve across the crown portion 110 as represented by the exemplary curve K in FIG. 6. This exemplary inflation growth is obtained by providing a certain inventive geometry or curve for the exemplary body ply H (along one or both sides of the centerline) of tire 100 as viewed in the meridian plane. The location of this inventive curve for body ply H is specified and claimed herein with reference to a "basis curve" (denoted as BC in the figures) that can be unambiguously constructed for any desired tire. More particularly, the basis curve can be unambiguously constructed from measurements of a physical specimen of an actual tire or constructed from one or more models of a tire such as e.g., a computer simulated model or a model from computer aided design (CAD)—as will be understood of one of skill in the art. As such, the basis curve is used herein to provide a clear reference for future measurements and for specification of the location of the body ply of the present invention.

Accordingly, "basis curve" as used in this description and the claims that follow is defined and constructed as will now be set forth with reference to the exemplary profile of a hypothetical tire having a belt ply W and body ply H as shown in FIG. 7. It should be understood that a tire of the present invention may have more than one belt ply. Belt ply W is used to represent the belt ply having the longest belt length along the axial direction—i.e. the widest belt as viewed in the meridian plane. For example, as shown in FIG. 1, belt ply 122 is the widest belt ply and would be represented by belt ply W in FIG. 7. Referring to FIG. 25, in addition to the longest belt length along the axial direction, belt ply W is also the longest of the belts having cords or similar reinforcements that are at angle α in the range of about −80 degrees ≤α≤+80 degrees with respect to the equatorial plane EP. As such, this definition for belt ply W excludes any belt in the crown portion that may be effectively functioning as a body ply.

As part of constructing the basis curve, the shape of body ply H is determined using the shape body ply H assumes when the tire is mounted on the application rim at a reference inflation pressure of 0.5 bar (designated e.g., as $C(s)^R$ in FIG. 5) with such rim providing the boundary conditions as set forth above in the discussion of inflation growth. As stated above, in the case of an actual physical specimen of the tire, the shape of body ply H in the meridian plane under such low inflation conditions can be measured experimentally using e.g. X-ray techniques or laser profilometry. In the case of a model of the tire such as e.g., a computer generated model, the shape of body ply H in the meridian plane under such low inflation conditions can be determined using e.g., finite element analysis (FEA).

FIG. 7 illustrates the shape of a portion of body ply H of tire 100 as viewed in the meridian plane, and only one half of body ply H is shown. The basis curve, denoted in FIG. 7 as BC, and the remaining description of the invention will be set forth using the left hand side (negative y) of the y-z plane (i.e. the portion of the tire to the left of the centerline C/L as viewed in FIG. 1), it being understood that the invention is symmetric for tire crown portions having symmetric belt architectures (i.e. with respect to a 180° rotation about the z-axis). The intersection of body ply H and the y=0 line defines the point a at the tire centerline. Body ply H can be parameterized in the y-z plane by the curve $C^R(s)$, where s is the curve length measured from point a. Clearly s∈[0, L], where L is the body ply half-length (i.e. one-half of the entire length of body ply H as measured along curve $C^R(s)$ in the meridian plane).

Next, considering all belt plies (such as e.g., plies 112, 114, and 116 in FIG. 1) in the crown portion of the tire that have cords at an angle α in the range of about −80 degrees ≤α≤+80 degrees, then M is defined be a point located at the end of the widest of all such belts as viewed in the meridian plane (i.e. belt W for this example), with parameter $s_M$ representing the maximum curvilinear half width along the axial direction of such belt W in the meridian plane. Additionally, $s_b$ is defined as $s_b=s_M-60$ mm, and the point b is defined as $b=C^R(s_b)$.

Using the definitions above, basis curve BC is constructed from two parts. Continuing with FIG. 7, the first part of basis curve BC includes an arc of a circle A of crown radius $r_s$ beginning at point a and passing through point b. The crown radius $r_s$ is determined by requiring the arc to be tangent to a horizontal line at point a. Note that this is equivalent to requiring that the center of the circle describing the arc lie on the y=0 line.

To specify the second part of basis curve BC, several additional points are now defined. First, let $s_e$ be the parameter value for which body ply H takes on its minimum value in y. The equator point e is defined as $e=C^R(s_e)=(y_e, z_e)$. An intermediate point f, not necessarily on the body ply H, is defined as $f=(y_e, z_e-30$ mm$)$. Q is defined as the vertical line passing through points e and f.

Next, a horizontal line is constructed through f. The point of closest intersection with body ply H is defined as point t, which occurs at parameter $s_t$ so that $t=C^R(s_t)$. A circle C with radius 20 mm is constructed tangent to the body ply at point t. The center of the circle is defined to be the point g located 20 mm laterally outward from body ply H along the line defined by the normal to body ply H at point t.

Accordingly, the second part of basis curve BC includes a radial equilibrium curve E that can now be determined in the following manner. In general, a radial equilibrium curve is characterized by 2 parameters: $r_c$, the center radius, and $r_e$, the equator radius. Here r is the usual cylindrical polar radial coordinate; it is equal to z when in the yz plane. The radial equilibrium curve E can be described by a differential equation and can also be unambiguously constructed starting from the center radius by calculating the tangent angle φ and curvature κ of the curve at each subsequent radius. The expressions for the tangent angle and curvature for a radial equilibrium curve are well known and are given as follows:

$$\sin\varphi = \frac{(r^2 - r_e^2)}{(r_c^2 - r_e^2)}$$

$$\kappa = \frac{2r}{(r_c^2 - r_e^2)}$$

To uniquely determine the parameters $r_s$ and $r_e$ of radial equilibrium curve E, a tri-tangency condition is imposed. First, the radial equilibrium curve E must be tangent to the arc A. The point of tangential intersection of these two curves will occur at a point k≠b in general. Second, the radial equilibrium curve E must be tangent with the line Q. Note that this point of tangency d≠e in general, although these points will be very close. Finally, radial equilibrium curve E must be tangent to the circle C. Note that, in general, this point of tangency will be at a point q≠t, although q is very close to t. These constraints uniquely determine the radial equilibrium curve E.

The basis curve BC is, therefore, defined from the above two parts as the union of the arc segment A from a to k with the radial equilibrium curve E between points k and q. The values of $r_c$ and $r_e$ for the radial equilibrium curve can be determined by many means known to one of usual skill in the art. For example, one method would be to begin by taking $r_c=z_b$ and $r_e=z_e$ and then iterating to find a solution.

The point M' is defined as the point a parameter distance $s_M$ along the basis curve BC. Note that, in general, the point M' will not lie exactly along a line $N_m$ that is normal to the basis curve BC and passes through point M, although it will typically be close.

Using the above definition of basis curve BC, it should be understood that the new geometry or shape of the exemplary body ply H of the present invention differs substantially from the shape of the basis curve BC along the shoulder and upper sidewall region of tire 100. Furthermore, this inventive geometry of the exemplary body ply H can be delineated by specifying its deviation from the basis curve BC parametrically as a function of curve length s as will be described.

FIG. 8 provides a plot of the distance of the body ply from a respective basis curve BC for each of four conventional, commercial tires: a 275/80R22.5 North American long haul steer tire, a 315/70R22.5 European regional steer tire, a 385/65R22.5 European regional trailer tire, and a 445/50R22.5 North American long haul WBS drive tire. For each tire represented, the associated plot line shows the distance ($D_{RX}(s)$), determined as previously set forth) of the tire's body ply from the basis curve BC constructed for that particular tire according to the definition set forth above. Here the reference curve R is the basis curve and the measurement curve X is the body ply $C^R$ at 0.5 bars under the boundary conditions described for inflation growth above.

By comparison, FIG. 9 provides a plot for each tire of the distance ($D_{RX}(s)$) of an exemplary new body ply H of the present invention from the basis curve constructed for each particular tire according to the definition set forth above. The results represent FEA simulations of a drive tire. As can be seen, the shape of the exemplary body ply H of the present invention is distinctive across a wide range of dimensions and applications and differs markedly from the conventional truck tires indicated.

Additionally, the exemplary new body ply H provides the desired uniform inflation growth across crown portion 110 of tire 100. For example, FIGS. 10 and 11 are plots of inflation growth (G(s), determined as previously set forth) for the same tires as in FIGS. 8 and 9 respectively. FIG. 10 illustrates the non-uniform inflation growth that results using a conventional body ply whereas FIG. 11 illustrates exemplary uniform inflation growth in the crown portion for the same tire using the inventive body ply of the present invention. The triangle depicted for each plot denotes the location of $s_M$, which was previously defined.

Referring again to FIG. 9, the inventors discovered that in order to provide uniform inflation growth, the exemplary new body ply H of the present invention deviates systematically from the basis curve BC as tire width is changed. This is illustrated explicitly in FIGS. 12 and 13. More particularly FIG. 12 shows the distance of exemplary body plies H of the present invention from the basis curve BC for the simulated 275/80R22.5, 385/65R22.5 and 445/50R22.5 drive tires from FIG. 11.

The inventors discovered that the form of the curve for the new body ply H is substantially constant along the upper sidewall and crown region. Accordingly, as used herein and the claims that follow, let D(s) represent the deviation between the basis curve BC and the body ply H at a location s along basis curve BC, where negative values for D(s) denote distances from the basis curve BC at locations radially inward of the basis curve BC and positive values denote distances from the basis curve that are radially outward of the basis curve BC. Deviation $D(s)=D_{BC\_H}(s)$ and is determined in a manner similar to that previously described for the distance between references curve R and X at $s_o$ in FIG. 4. As such, the deviation D(s) from the basis curve for the exemplary new body ply H over a range of tire sizes can be specified by defining a new shifted parameter s' as follows:

$$s'=s-s_b \qquad \text{Equation 1:}$$

where
s' is the shifted length along the basis curve BC
s is the length along the basis curve $s_b$ is the parameterized length of point b along the basis curve BC (point b is defined above as $s_b=s_M-60$ mm)

FIG. 13 illustrates an alignment between all tires studied when plotting this new shifted parameter s' for locations between $s=s_b$ and $s=s_d$, which corresponds to s'=0 and $s'=s_d-s_b$. The curve for the deviation D(s) of the new body ply H from a basis curve at any point s' can be fit using a Gaussian distribution as follows:

$$D(s') = D_0 \exp\left\{-\frac{(s'-\mu)^2}{2\sigma^2}\right\} \qquad \text{Equation 2}$$

where:
D (s') is the distance or deviation of the exemplary body ply H from the basis curve BC for a given tire with negative values denoting locations radially inward of basis curve BC and positive values denoting locations radially outward of basis curve BC.
$D_0$ is the magnitude
$\mu$ is the mean
$\sigma$ is the standard deviation of the distance or deviation function FIG. 14 is a comparison of a plot N of the shifted curve length s' for the 445/50R22.5 tire of FIG. 13 having the exemplary new body ply of the present invention with a plot J created using Equation 2 with $D_0=-4.5$ mm, $\mu=0.53$ mm, and $\mu=24$ mm. Only the 445/50R22.5 dimension is shown for clarity. As shown, the Gaussian distribution of Equation 2 fits well using the values indicated. Referring again to FIG. 13, the deviation D(s') is negative in a region centered about s'=54 mm and returns to near zero at $s=s_d$ ($s'=s_d-s_b$). In addition, deviation D(s') is zero by geometric construction at $s=s_b$ (s'=0). The deviation at about s'=54 mm is large compared with typical manufacturing tolerances, which can be on the order of e.g., 0.5 mm.

Accordingly, returning to FIG. 1, in one exemplary embodiment of the present invention, at point $s_b+54$ mm the body ply H is located radially inward of the basis curve BC for the exemplary tire 100 by a deviation D(s) that is in the range of $-7.5$ mm$\leq$D(s)$\leq$3 mm. As previously set forth, point $s_b$ is defined as $s_b=s_M-60$ mm and point $s_M$ represents the maximum curvilinear half width of the widest belt ply in the crown region as described above.

FIG. 15 provides an illustration of deviation D(s) as a function of the shifted curve length s'. The bracketed zone Z extends from $-7.5$ mm$\leq$D(s)$\leq-3$ mm. Also depicted is a plot H of D(s) for an exemplary tire of size 445/50R22.5 that includes an exemplary body ply of the present invention that is spaced from its basis curve by an amount that is within the bracketed zone Z. Plot J is a hypothetical curve, shown for illustration purposes, that would also fall within the bracketed zone.

When constructed with such a body ply H, tire 100 has an inflation growth amplitude A that is less, or equal to, about 1.25 mm when tire 100 is inflated from a pressure of about 0.5 bar to about the maximum sidewall pressure. Referring back to FIG. 7, as used herein, the shoulder portion is defined as the portion between the points M' and b on the basis curve BC. The maximum, minimum and amplitude of inflation growth G in this region at a given azimuthal angle $\theta$ is defined in the following manner:

$$G_{max}(\theta) = \max_{s \in [b, 0.9 \ast s_M]} G(s, \theta) \qquad \text{Equation 3}$$

-continued $$G_{min}(\theta) = \min_{s \in [b, 0.9*s_M]} G(s, \theta) \qquad \text{Equation 4}$$

$$A(\theta) = G_{max}(\theta) - G_{min}(\theta) \qquad \text{Equation 5}$$

FEA based calculations of inflation growth are typically 2d axi-symmetric simulations, automatically predicting the same amplitude at all azimuthal angles. For physical tire measurements, however, inflation growth can vary from azimuth to azimuth around the tire. Accordingly, the final measurement of the inflation growth amplitude measurement A as used herein and the claims that follow is defined as an average of n≥4 evenly spaced azimuthal measurements in the following fashion:

$$A \equiv \frac{1}{n} \sum_{i=0}^{n-1} A\left(\theta = \frac{360°}{n} i\right)$$

In one exemplary embodiment, when constructed with such a body ply H, tire 100 has an inflation growth amplitude A that is less, or equal to, about 1.25 mm when the tire is inflated from a pressure of about 0.5 bar to about the maximum sidewall pressure and has a crown radius $r_s$ greater than, or equal to, about 2000 mm. In still another exemplary embodiment, tire 100 has at least one belt ply with a belt width in meridian plane in the range of about 120 mm to about 444 mm. In still another embodiment, tire 100 has at least one belt ply with a belt width in meridian plane in the range of about 204 mm to about 444 mm. In still another exemplary embodiment, tire 100 has an aspect ratio in the range of 50 to 55 and/or a section width in the range of 445 mm to 455 mm. For example, tire 100 might have a tire size of 445/50R22.5 or, in another example, might have a tire size of 455/55R22.5

Referring to FIGS. 16, 17, 18, and 19, the present invention may be further understood with reference to certain tire designs that were constructed as computer or CAD (computer-aided design) models and submitted to FEA analysis. More particularly, computer models of four WBS tires were created using dimensions of 445/50R22.5 and 455/55R22.5. Two designs of each dimension were created in a CAD system, one with a crown radius $r_s$=2000 mm and a second with a crown radius $r_s$=10000 mm. These radii were chosen since 2000 min represents a highly curved surface for a WBS tire and 10,000 mm and above are essentially flat. Ten versions of each of these four tires were then simulated by varying the parameter $D_0$ from about 0.2 mm to about 7.7 mm over ten steps using the design methods described above. FEA simulations were carried out on all the tires models.

The results of these parameterization studies are set forth in FIGS. 16, 17, 18, and 19. FIG. 16 shows a tire of size 445/50R22.5 with a crown radius of 2000 mm. FIG. 17 depicts a tire of size 445/50R22.5 with a crown radius of 10000 mm. FIG. 18 depicts a tire size of 455/55R22.5 with a crown radius of 2000 mm. FIG. 19 depicts a tire of size 455/55R22.5 with a crown radius of 10000 mm. In each of FIGS. 16, 17, 18, and 19 the region illustrated extends from s'=0 to s'=$s_m$-$s_b$=60 mm, which reflects the zone over which inflation growth amplitude A is defined. FIG. 20 provides a summary of the inflation growth amplitude A as a function of parameter $D_o$ for each of the tires in the studies of FIGS. 16, 17, 18, and 19. The maximum inflation growth amplitude occurs in the region from s'=0 to s'=$s_m$-$s_b$=60 mm, which reflects the zone over which inflation growth amplitude A is defined. FIG. 20 clearly shows that the range −7.5 mm≤D(s)≤−3 mm captures the range of deviation in which an inflation growth amplitude A that is less, or equal to, about 1.25 mm.

Tests for cracking along a groove-bottom in the tread portion of a tire (such as groove bottom 128 or 130 in the exemplary tire 100 of FIG. 1) was performed by rolling a tire under load over a drum in an environment having highly elevated ozone levels. FIGS. 21 and 22 shows results from such a test involving a commercially available 445/50R22.5 WBS tire (designated by letters W and A) and a 445/50R22.5 WBS tire having a body ply positioned relative to its basis curve in accordance with an exemplary embodiment of the present invention (designated by letters B and C). FIG. 21 provides a plot of crack density at 30,000 km while FIG. 22 provides a plot of crack density at 80,000 km of such testing. Each tire was manufactured with two different compounds for the tread portion so that letters W and B have compound 1 and letters A and C have compound 2. As shown in FIGS. 21 and 22, the tire constructed according to an exemplary embodiment of the present invention (designated by letters B and C) had no visible cracks after 30,000 km of testing and a greatly reduced number and severity of cracks after 80,000 km.

The present invention also provides for an exemplary method of designing or constructing tire 100. Such method could be used to improve the body ply for an existing tire design or could be used in creating a new tire design. In either case, for this exemplary method, the designer would begin by creating a model of the tire that includes a reference curve representing the shape of the body ply along a meridian plane when the tire is inflated to a reference pressure, wherein s is a length in mm along the reference curve from a centerline of the tire. For an existing tire, the reference curve could be created as described above using physical measurements of a specimen of the tire subjected to e.g., X-ray, laser profilometry, or other techniques. For a new tire design, the reference curve could be created from e.g., CAD models or other computer models of the tire. The reference pressure could be e.g., 0.5 bar or other pressures as set forth above.

Next, a basis curve is constructed for the tire based upon the reference curve of the tire at the reference pressure. The basis curve is constructed e.g., as previously described.

Using the basis curve, a target reference curve is created for the shape of the body ply along the meridian plane. This target reference curve is the desired curve or geometry for the new body ply—such as e.g., the exemplary body ply H discussed above—to be used in the tire. The target reference curve is created by repositioning the reference curve to have a deviation D(s) from the basis curve that is in the range of −7.5 mm≤D(s)≤−3 mm on at least one side of the tire centerline at a point $s_b$+54 mm along the curve of the body ply, where $s_b$ is equal to $s_M$−60 mm and $s_M$ is one-half of length L. The target reference curve could be created by repositioning the reference curve on both sides of the tire centerline as well. As used herein, the expression −7.5 mm≤D(s)≤−3 mm includes the end points of the range—i.e. −3 mm and −7.5 mm.

For an existing tire, the design would be changed to include the new shape of the body ply. This would include changes to manufacture the tire having the new body ply. For a newly designed tire, the design would include the new profile or curve for the body ply. Accordingly, the present invention includes tires constructed and manufactured having the new inventive body ply providing for uniform inflation growth as described herein.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art using the teachings disclosed herein.

What is claimed is:

1. A tire defining a radial direction, an axial direction, and a tire centerline, the tire comprising:
    a pair of opposing bead portions;
    a pair of opposing sidewall portions connected with the opposing bead portions;
    a crown portion connecting the opposing sidewall portions;
    a body ply extending between the bead portions and through the sidewall and crown portions, the body ply having a curve along a meridian plane, wherein s is the length in mm along the curve from centerline of the tire; and
    one or more belt plies positioned in the crown portion, wherein $s_M$ is one-half of the maximum curvilinear width, along the axial direction, of the widest belt of the one or more belt plies; and
    where within a cross-section along the meridian plane; the body ply is located radially inward of a basis curve along at least one side of the tire centerline by a deviation D(s), with $-7.5 \text{ mm} \leq D(s) \leq -3$ mm at a point $s_b+54$ mm along the curve of the body ply, where
    $s_b$ is equal to $s_M-60$ mm,
    D(s) is deviation from the basis curve, with the basis curve defined from a shape the body ply has in the meridian plane when the tire is mounted on an application rim at a reference inflation pressure of 0.5 bar.

2. The tire of claim 1, wherein the tire has a maximum sidewall pressure, and wherein the tire has an inflation growth amplitude A that is less, or equal to, about 1.25 mm when the tire is inflated from a pressure of about 0.5 bar to about the maximum sidewall pressure.

3. The tire of claim 1, wherein the tire has a crown radius of greater than, or equal to, about 2000 mm.

4. The tire of claim 1, wherein the tire has a crown radius of greater than, or equal to, about 3000 mm.

5. The tire of claim 1, wherein the one or more belt plies comprises a plurality of belt plies.

6. The tire of claim 1, wherein when the body ply is represented by a curve C(s) in the meridian plane and L is the body ply half-length, L is in the range of about 60 mm to about 222 mm.

7. The tire of claim 1, wherein at least one belt ply has a belt width in meridian plane in the range of about 102 mm to about 222 mm.

8. The tire of claim 1, wherein when a basis curve is constructed for the body ply, along both sides of the tire centerline the body ply is located radially inward of the basis curve with a deviation D(s), where $-7.5 \text{ mm} \leq D(s) \leq -3$ mm at a point $s_b+54$ mm along the profile of the body ply, where $s_b$ is equal to $s_M-60$ mm.

9. The tire of claim 1, wherein the tire has an aspect ratio in the range of 50 or 55.

10. The tire of claim 9, wherein the tire has a section width in the range of 445 mm to 455 mm.

11. The tire of claim 1, wherein the basis curve is constructed at a reference pressure of 0.5 bar.

12. A method of tire construction, the tire including a pair of opposing bead portions, a pair of opposing sidewall portions connected with the opposing bead portions, a crown portion connected with, and extending along an axial direction between, the opposing sidewall portions, at least one body ply extending between the bead portions and through the crown portion and sidewall portions, at least one belt ply located in the crown portion, the at least one belt ply being the widest belt ply along the axial direction of the tire, the method of tire construction comprising the steps of:
    creating a model of the tire that includes a reference curve representing the shape of the body ply along a meridian plane when the tire is inflated to a reference pressure, wherein s is a length in mm along the reference curve from a centerline of the tire;
    constructing a basis curve for the tire based upon the reference curve of the tire at the reference pressure;
    creating a target reference curve for the shape of the body ply along the meridian plane by repositioning the reference curve to have a deviation D(s) from the basis curve, and wherein $-7.5 \text{ mm} \leq D(s) \leq -3$ mm on at least one side of the tire centerline at a point $s_b+54$ mm along the curve of the body ply, where $s_b$ is equal to $s_M-60$ mm and $s_M$ is one-half of the maximum curvilinear along the axial direction of the widest belt ply;
    wherein the tire has a maximum sidewall pressure, and wherein when the body ply is positioned according to the target reference curve, the tire has an inflation growth amplitude A that is less, or equal to, about 1.25 mm when the tire is inflated from a pressure of about 0.5 bar to about the maximum sidewall pressure.

13. The method of tire construction as in claim 12, wherein the step of creating a model of the tire comprises determining the reference curve using finite element analysis.

14. The method of tire construction as in claim 12, wherein the step of creating a model of the tire comprises subjecting a physical specimen of the tire to measurement of the body ply.

15. The method of tire construction as in claim 12, wherein the step of creating a model of the tire comprises subjecting a physical specimen of the tire to X-ray of the body ply.

16. The method of tire construction as in claim 12, wherein said creating step comprises repositioning the reference curve to have a deviation D(s) from the basis curve, and wherein $-7.5 \text{ mm} \leq D(s) \leq -3$ mm on both sides of the tire centerline at a point $s_b+54$ mm along the profile of the body ply, where $s_b$ is equal to $s_M-60$ mm and $s_M$ is one-half of length L.

17. The method of tire construction as in claim 12, wherein the tire has a crown radius of greater than, or equal to, about 2000 mm.

18. The method of tire construction as in claim 12, further comprising manufacturing the tire with the body ply having a geometry according to the target reference curve.

* * * * *